(12) United States Patent
Hsueh et al.

(10) Patent No.: US 9,865,697 B1
(45) Date of Patent: Jan. 9, 2018

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Jen-Chih Hsueh, Kaohsiung (TW); Rong-Yu Wu, Hsinchu (TW); Yi-Wei Chiu, Kaohsiung (TW); Tsung-Fan Yin, Kaohsiung (TW); Ying-Ting Hsia, Kaohsiung (TW); Li-Te Hsu, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/247,547

(22) Filed: Aug. 25, 2016

(51) Int. Cl.
| | |
|---|---|
| *H01L 21/28* | (2006.01) |
| *H01L 29/49* | (2006.01) |
| *H01L 29/78* | (2006.01) |
| *H01L 29/08* | (2006.01) |
| *H01L 29/161* | (2006.01) |
| *H01L 29/16* | (2006.01) |
| *H01L 29/165* | (2006.01) |

(Continued)

(52) U.S. Cl.
CPC .... *H01L 29/4966* (2013.01); *H01L 21/28088* (2013.01); *H01L 29/0847* (2013.01); *H01L 29/161* (2013.01); *H01L 29/165* (2013.01); *H01L 29/1608* (2013.01); *H01L 29/41775* (2013.01); *H01L 29/66545* (2013.01); *H01L 29/66636* (2013.01); *H01L 29/66795* (2013.01); *H01L 29/7848* (2013.01); *H01L 29/7851* (2013.01)

(58) Field of Classification Search
CPC ............ H01L 29/4966; H01L 29/7848; H01L 29/161; H01L 29/1608; H01L 29/165; H01L 29/66636; H01L 29/0847; H01L 29/41775; H01L 21/28088; H01L 29/66545; H01L 29/66795; H01L 29/7851; H01L 29/66871
See application file for complete search history.

(56) References Cited

U.S. PATENT DOCUMENTS

| 7,667,271 B2 | 2/2010 | Yu et al. |
| 7,910,453 B2 | 3/2011 | Xu et al. |

(Continued)

*Primary Examiner* — Hoang-Quan Ho
(74) *Attorney, Agent, or Firm* — Birch, Stewart, Kolasch & Birch, LLP

(57) ABSTRACT

A method for forming a semiconductor device structure is provided. The method includes forming a spacer layer and a dielectric layer over a substrate. The spacer layer has an opening exposing the substrate, and the dielectric layer surrounds the spacer layer. The method includes forming a metal silicon nitride layer over a sidewall and a bottom surface of the opening. The method includes forming a first work function metal layer over the metal silicon nitride layer. The method includes removing a first top portion of the first work function metal layer. The method includes, after the removal of the first top portion, removing a second top portion of the metal silicon nitride layer. The method includes forming a conductive layer in the opening. The method includes removing a third top portion of the conductive layer and a fourth top portion of the metal silicon nitride layer.

20 Claims, 27 Drawing Sheets

(51) Int. Cl.
*H01L 29/417* (2006.01)
*H01L 29/66* (2006.01)

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 2014/0001574 A1 | 1/2014 | Chen et al. |
| 2014/0110755 A1 | 4/2014 | Colinge |
| 2014/0151812 A1 | 6/2014 | Liaw |
| 2015/0187946 A1* | 7/2015 | Park .................. H01L 29/66795 257/368 |
| 2016/0064378 A1* | 3/2016 | Kwon ............... H01L 21/82345 257/401 |
| 2017/0117190 A1* | 4/2017 | Chung ............ H01L 21/823842 |

* cited by examiner

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. For example, since a width of an opening of a spacer layer continues to decrease, etching processes continue to become more difficult to perform in the opening. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
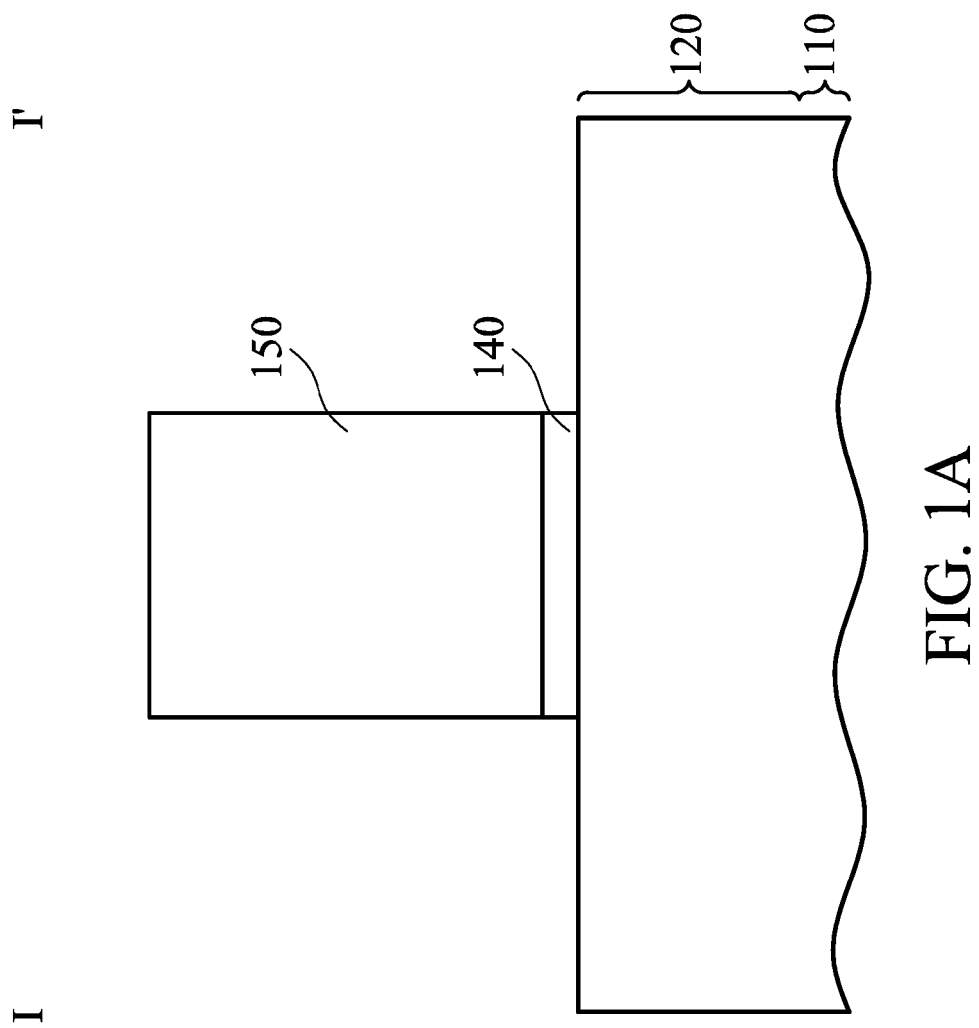
FIGS. 1A-1V are cross-sectional views of various stages of a process for forming a semiconductor device structure 100, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
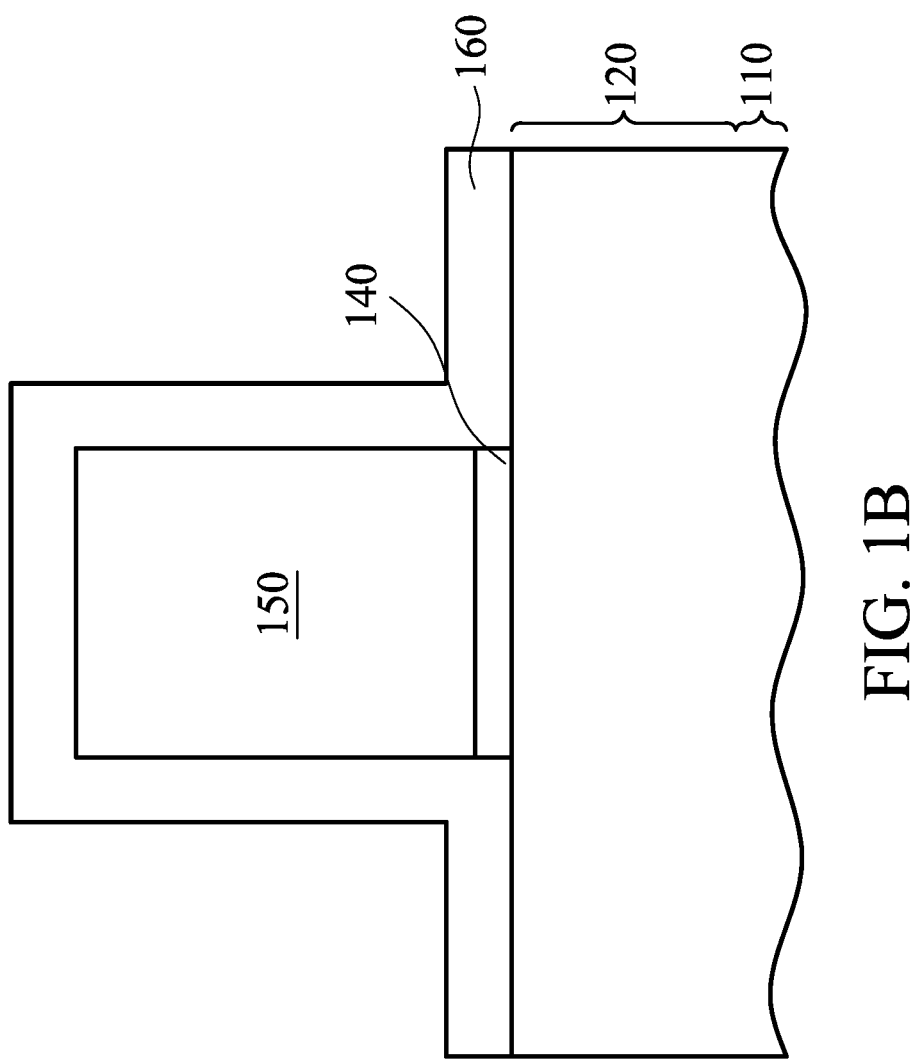
Figure 1C:
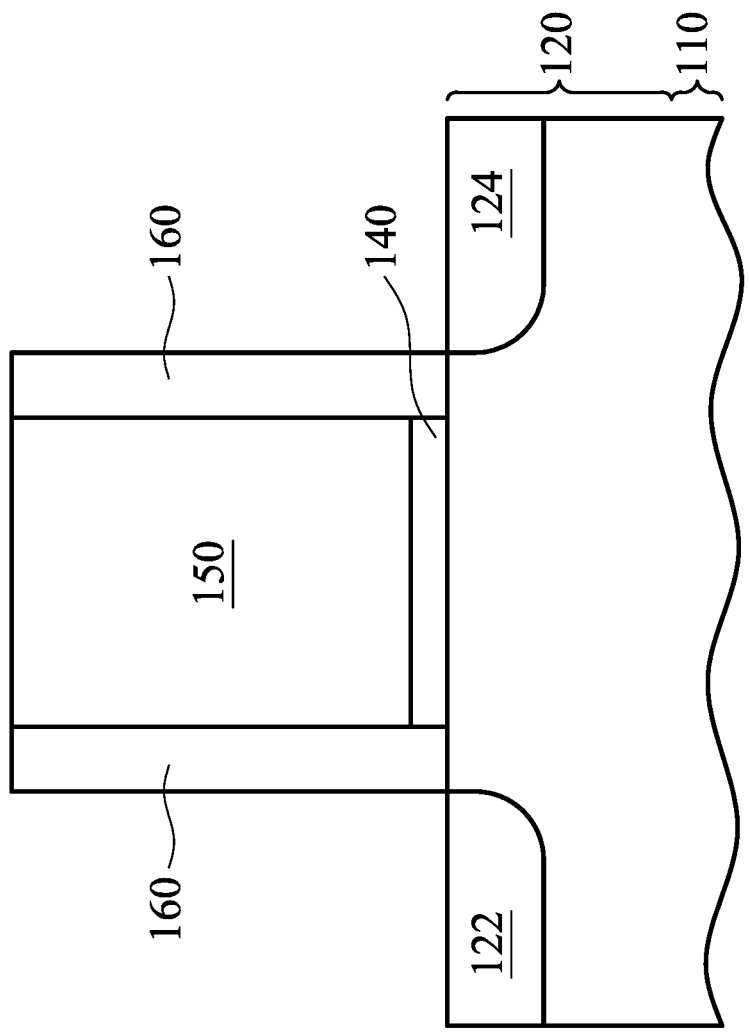
Figure 1D:
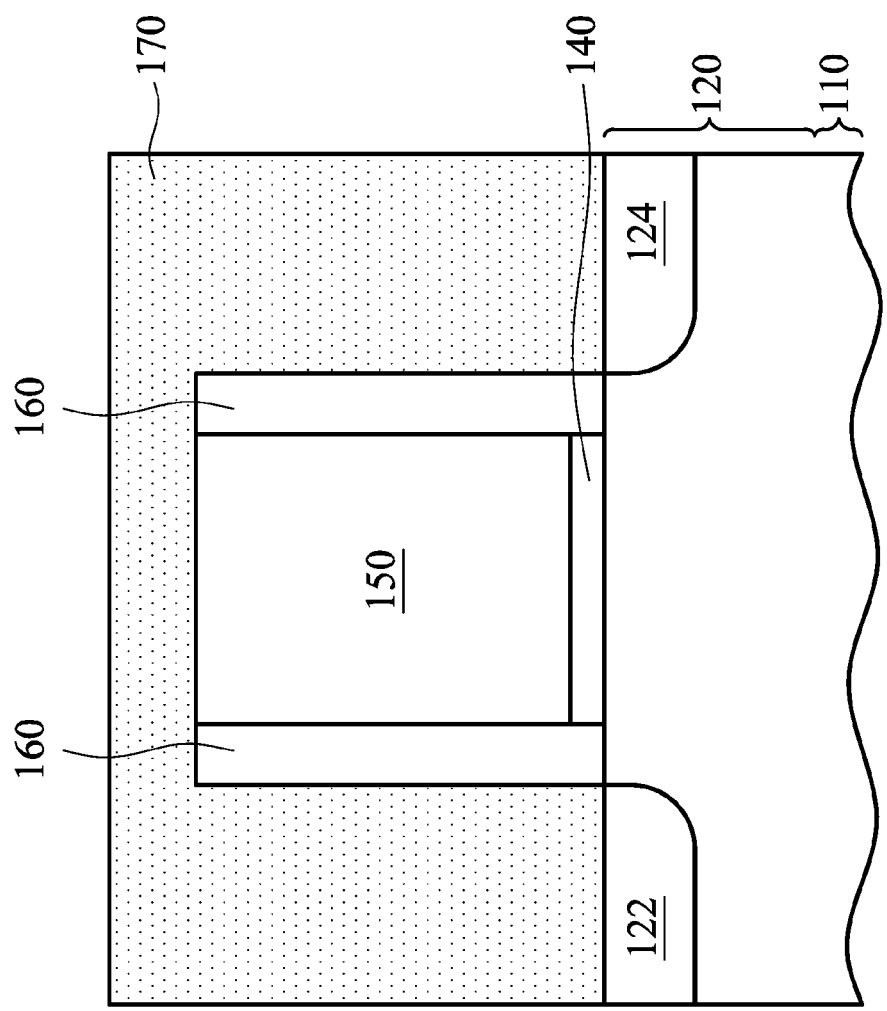
Figure 1E:
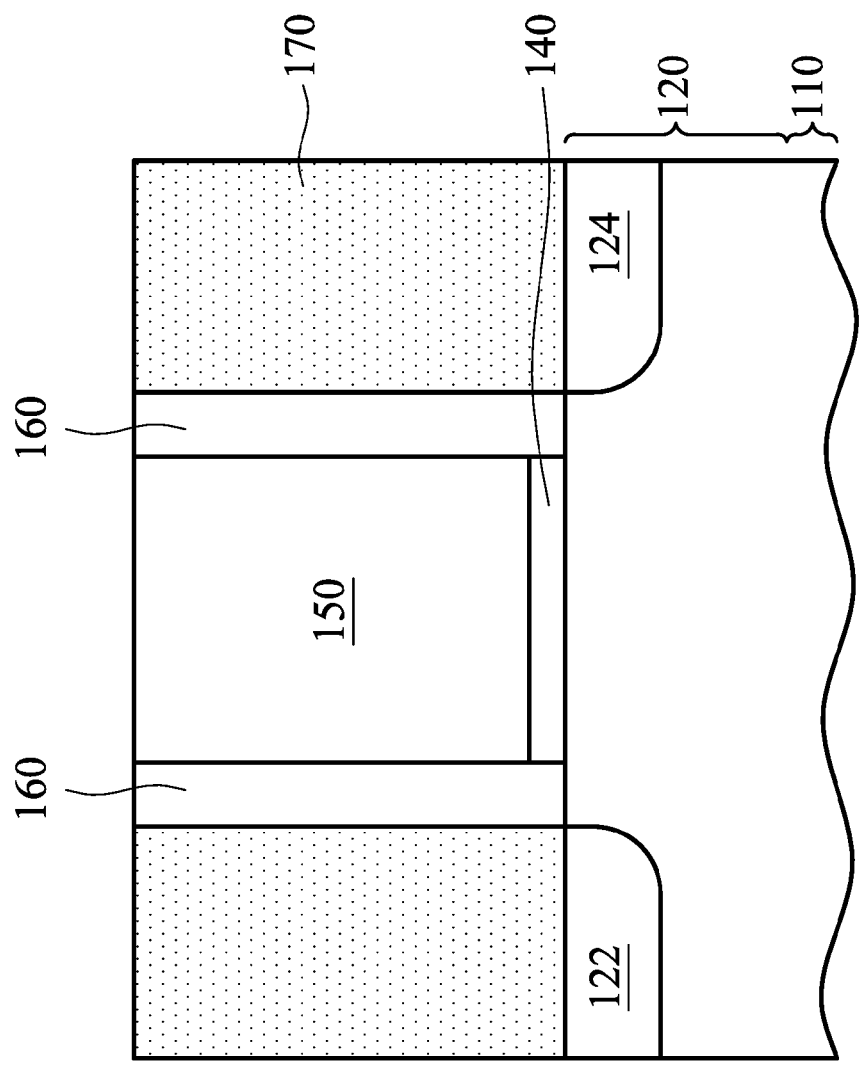
Figure 1F:
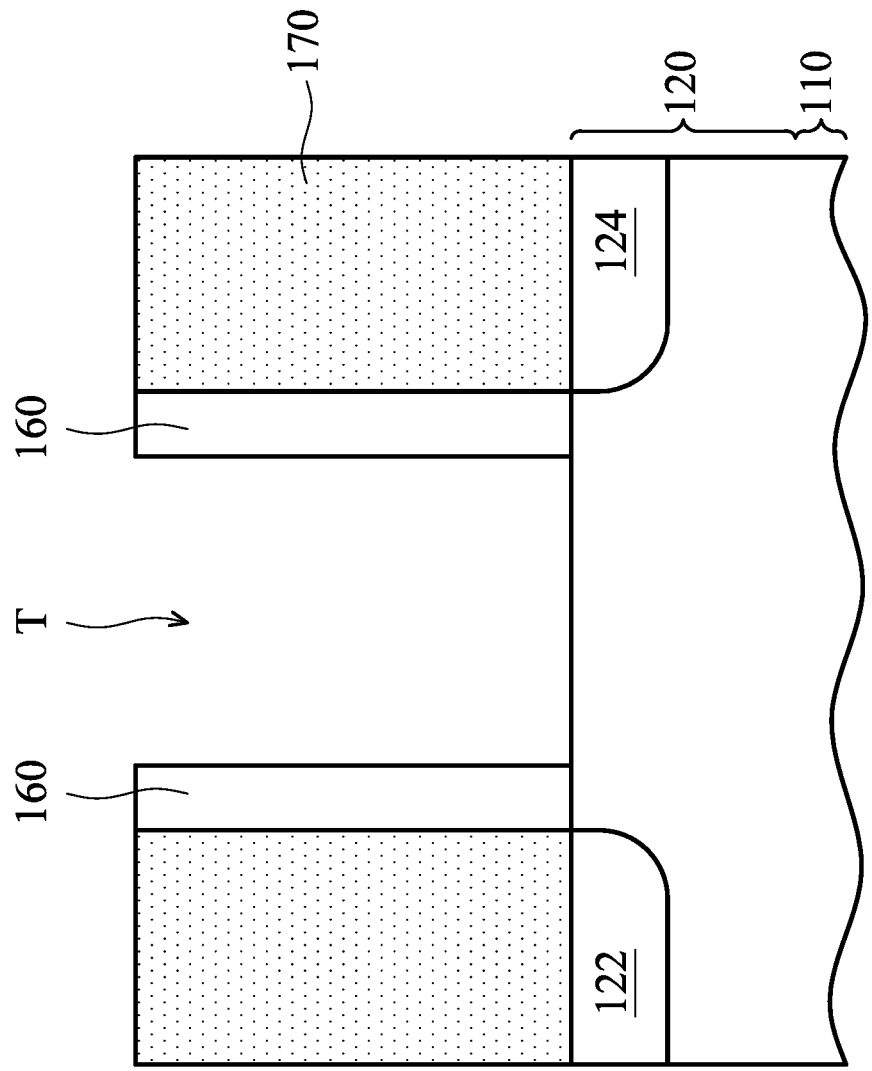
Figure 1G:
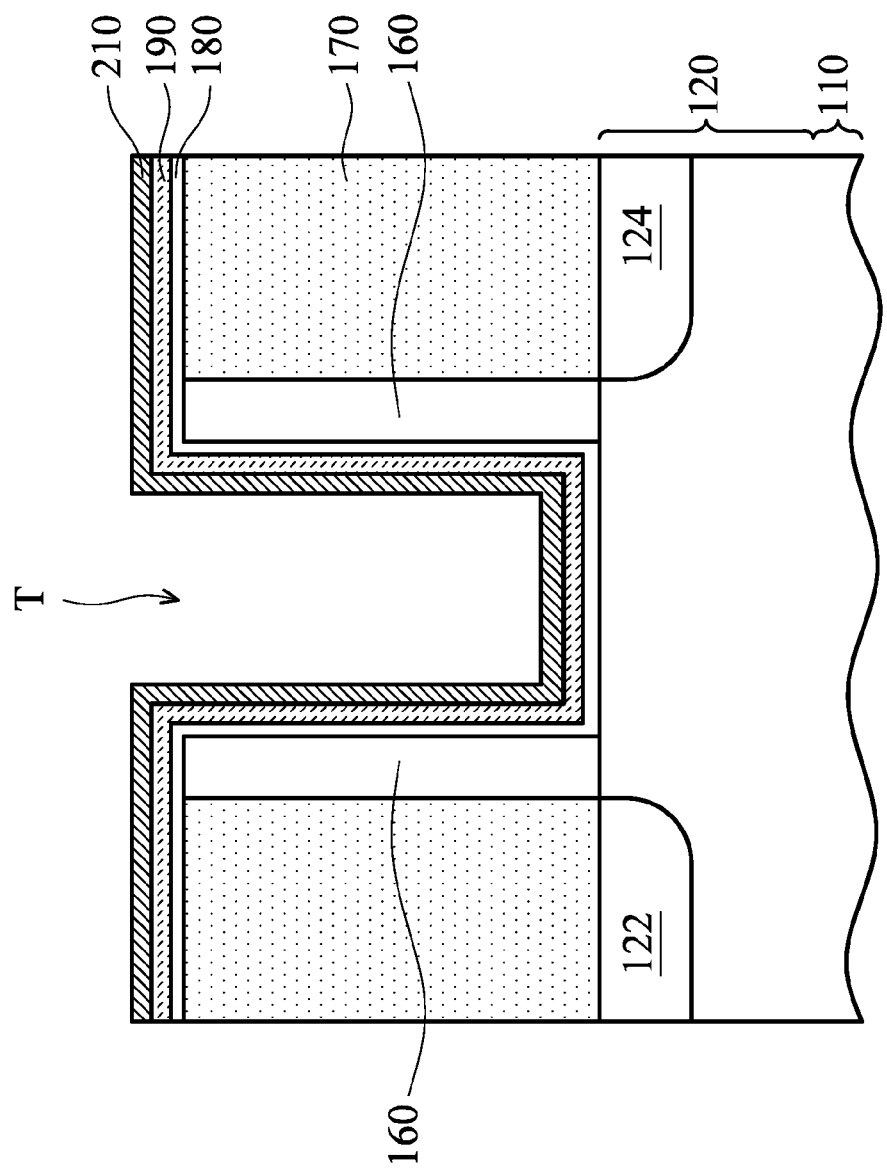
Figure 1H:
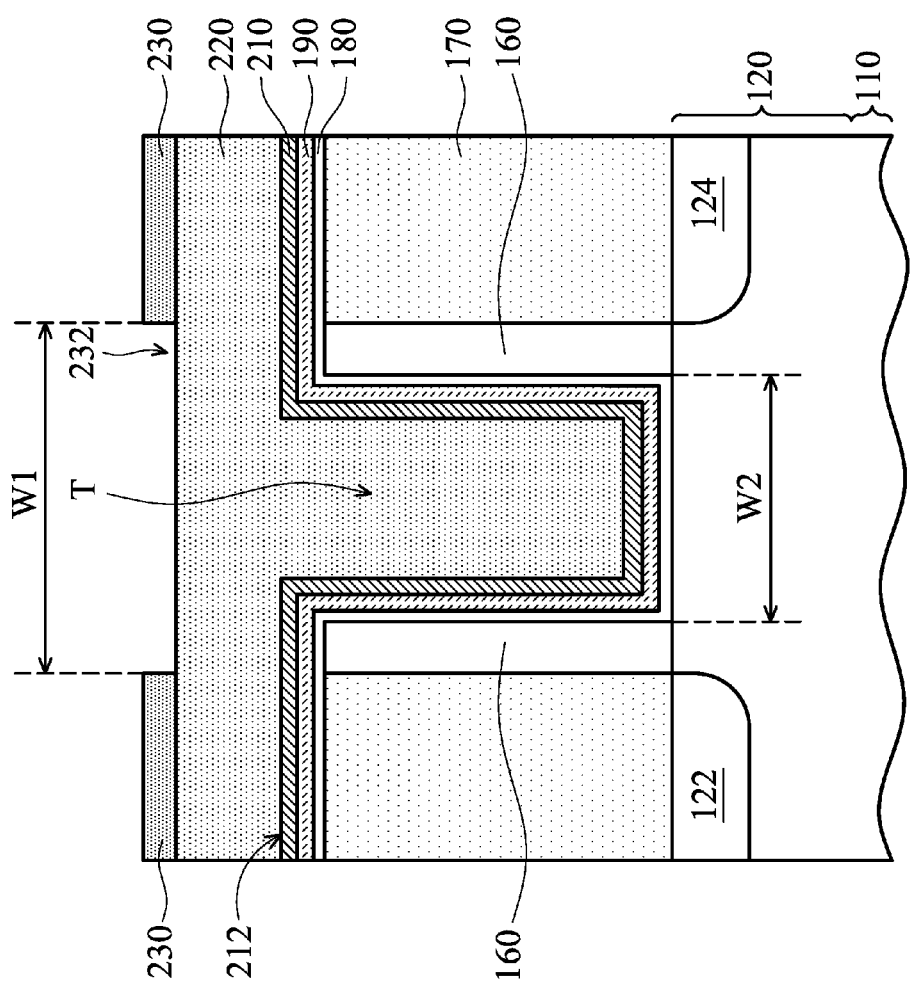
Figure 1I:
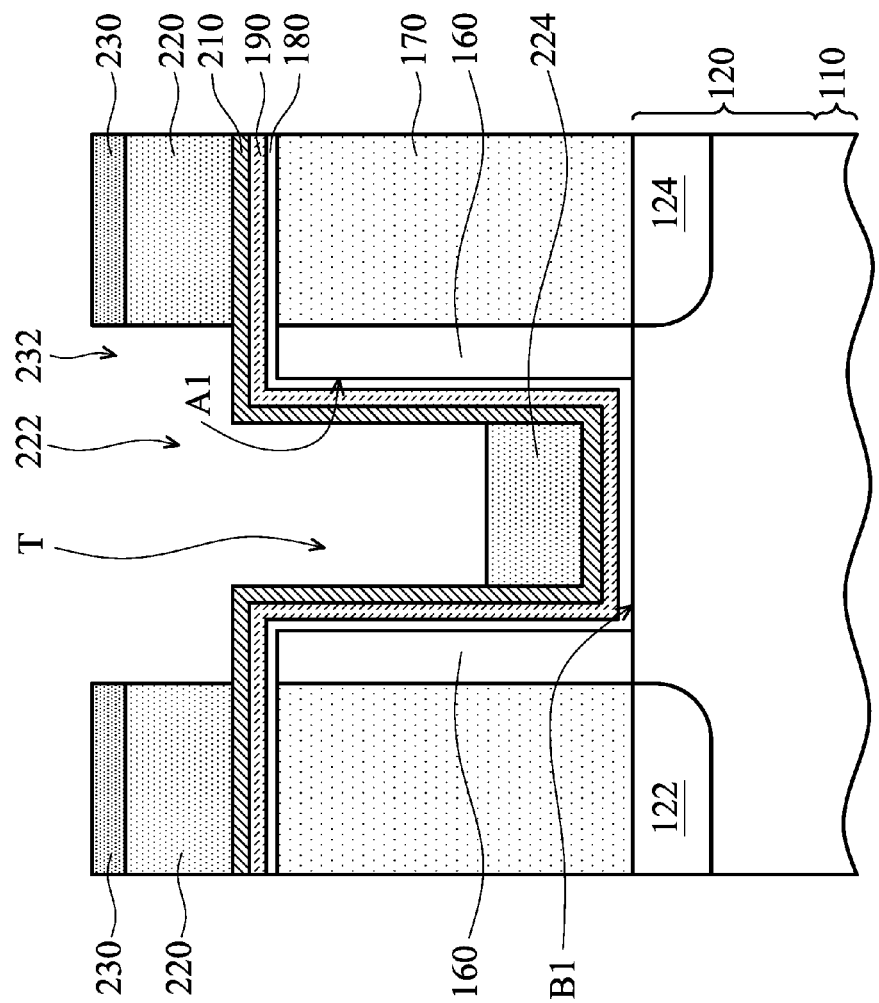
Figure 1J:
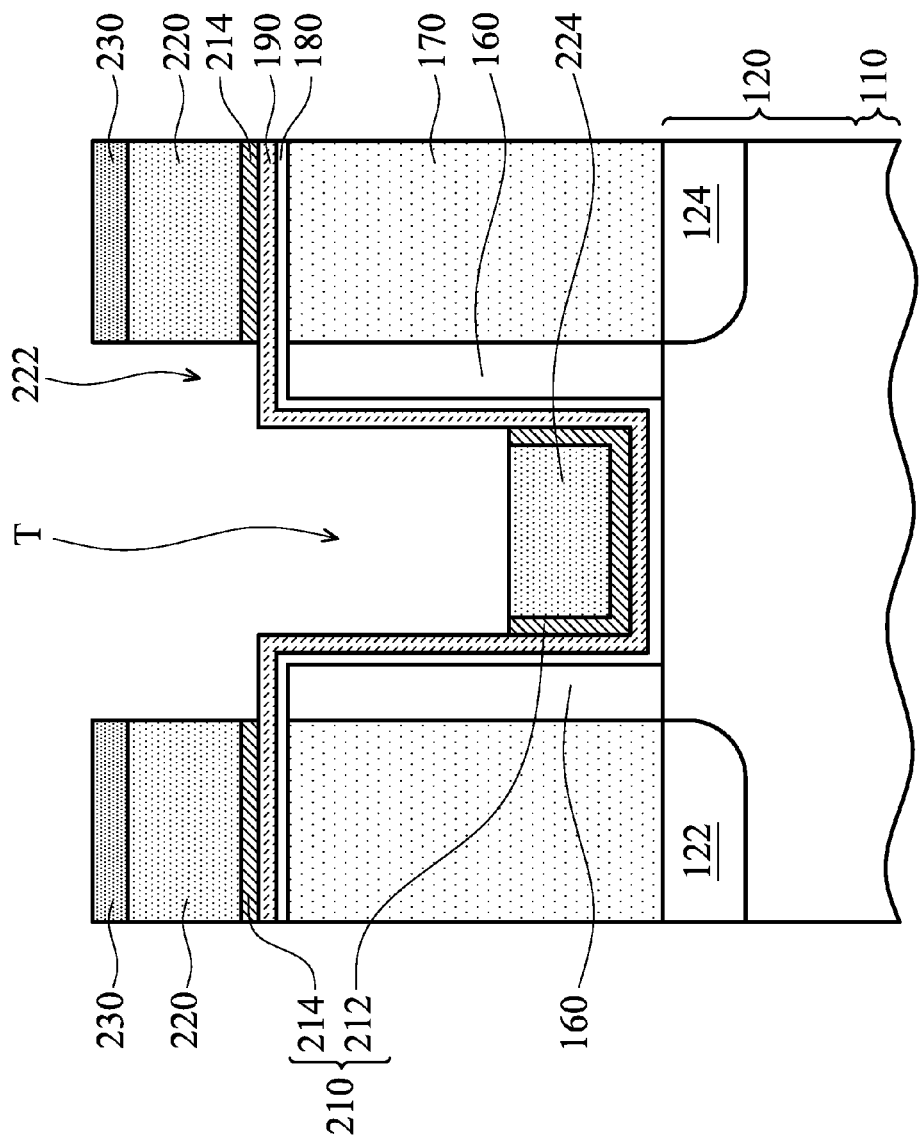
Figure 1K:
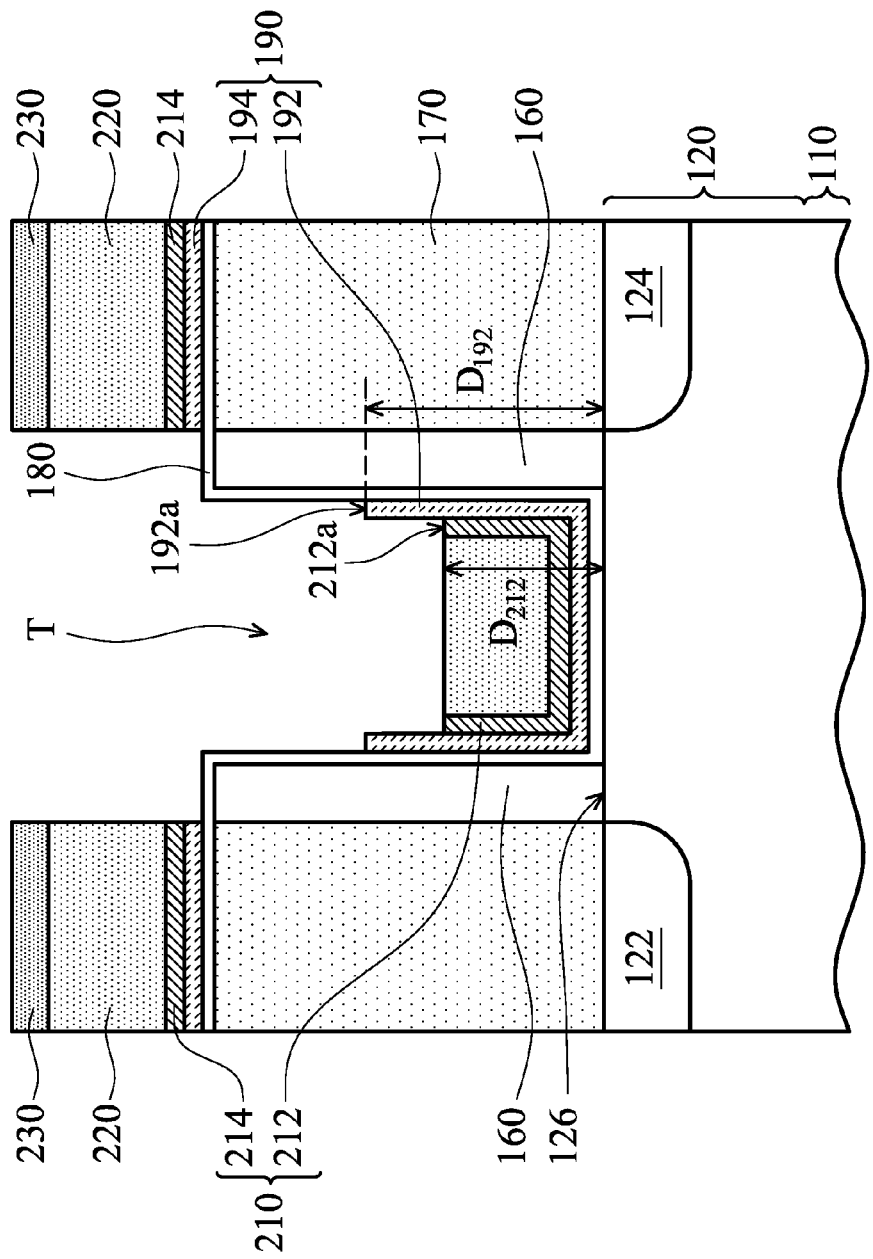
Figure 1L:
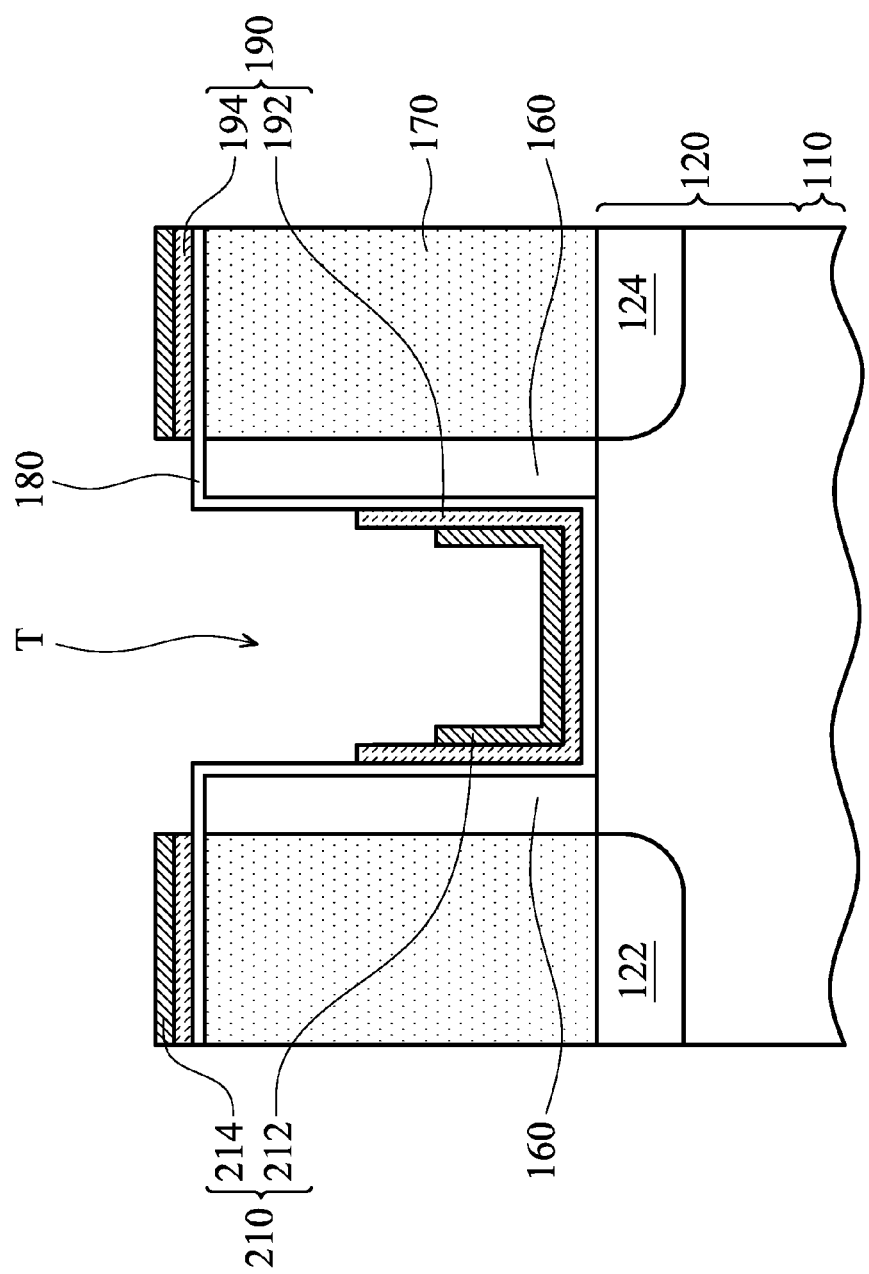
Figure 1M:
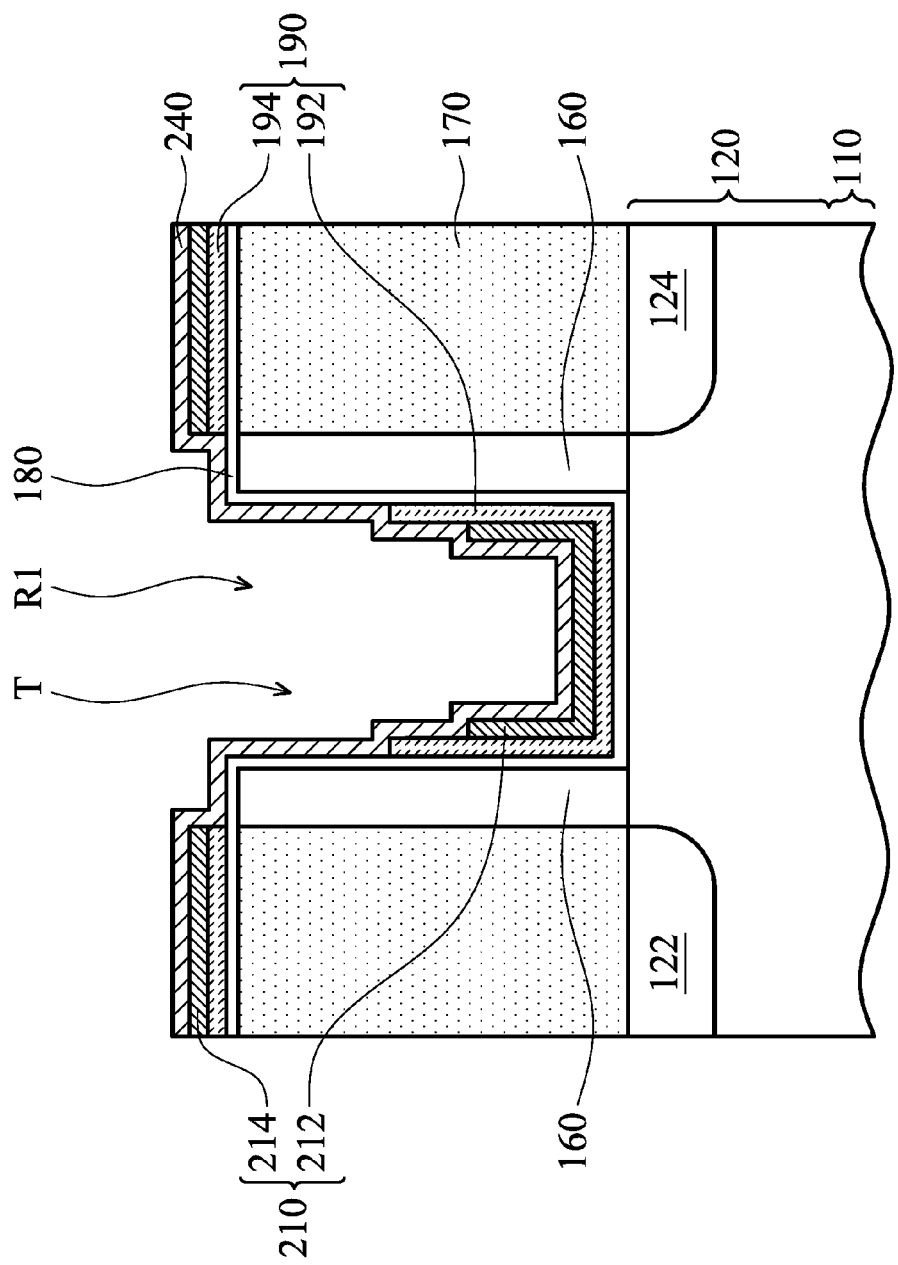
Figure 1N:
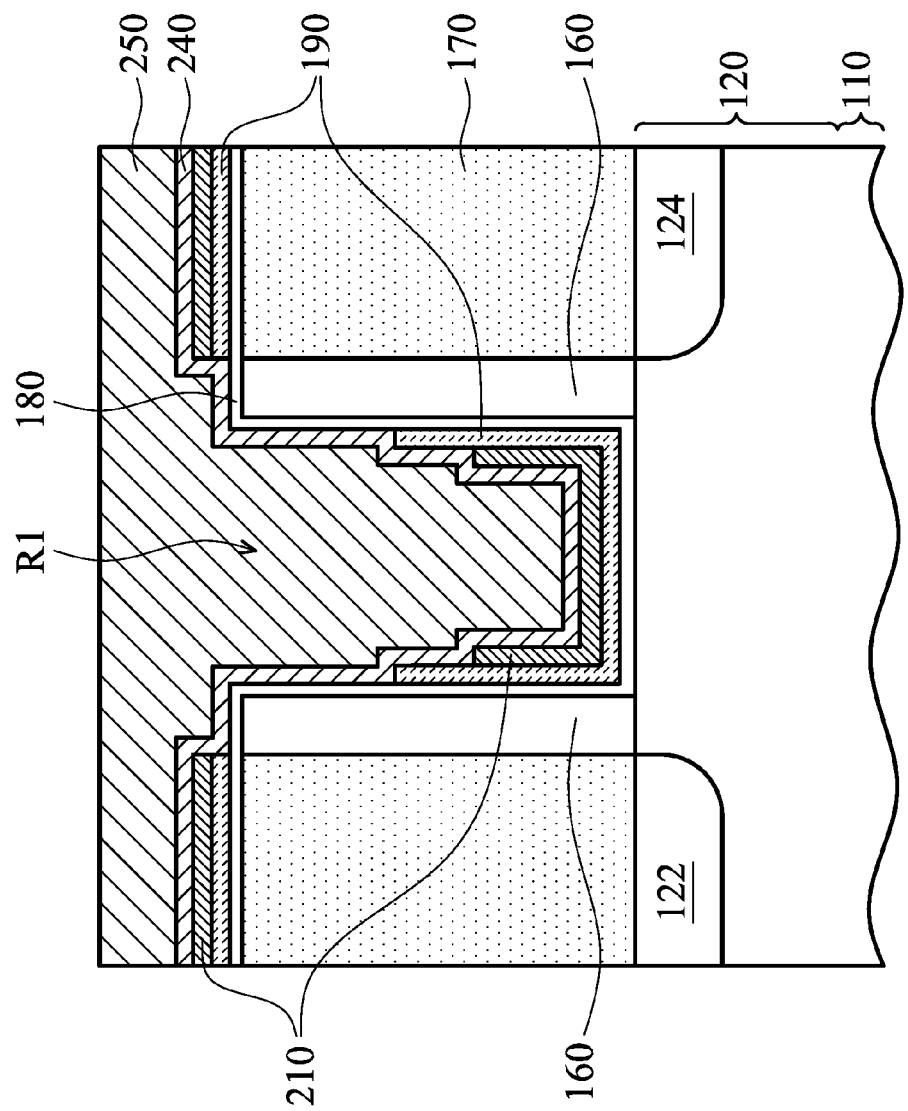
Figure 1O:
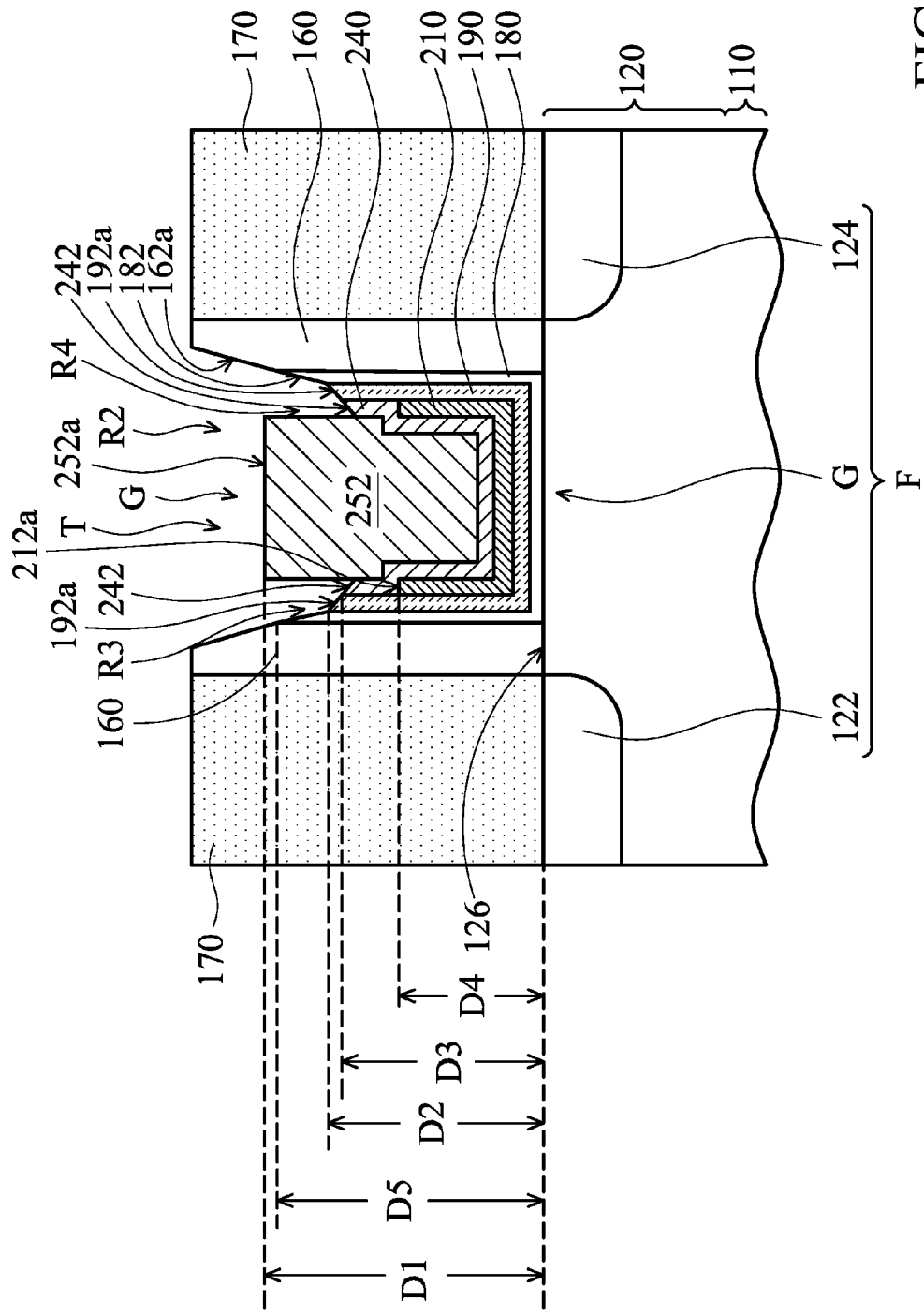
Figure 1P:
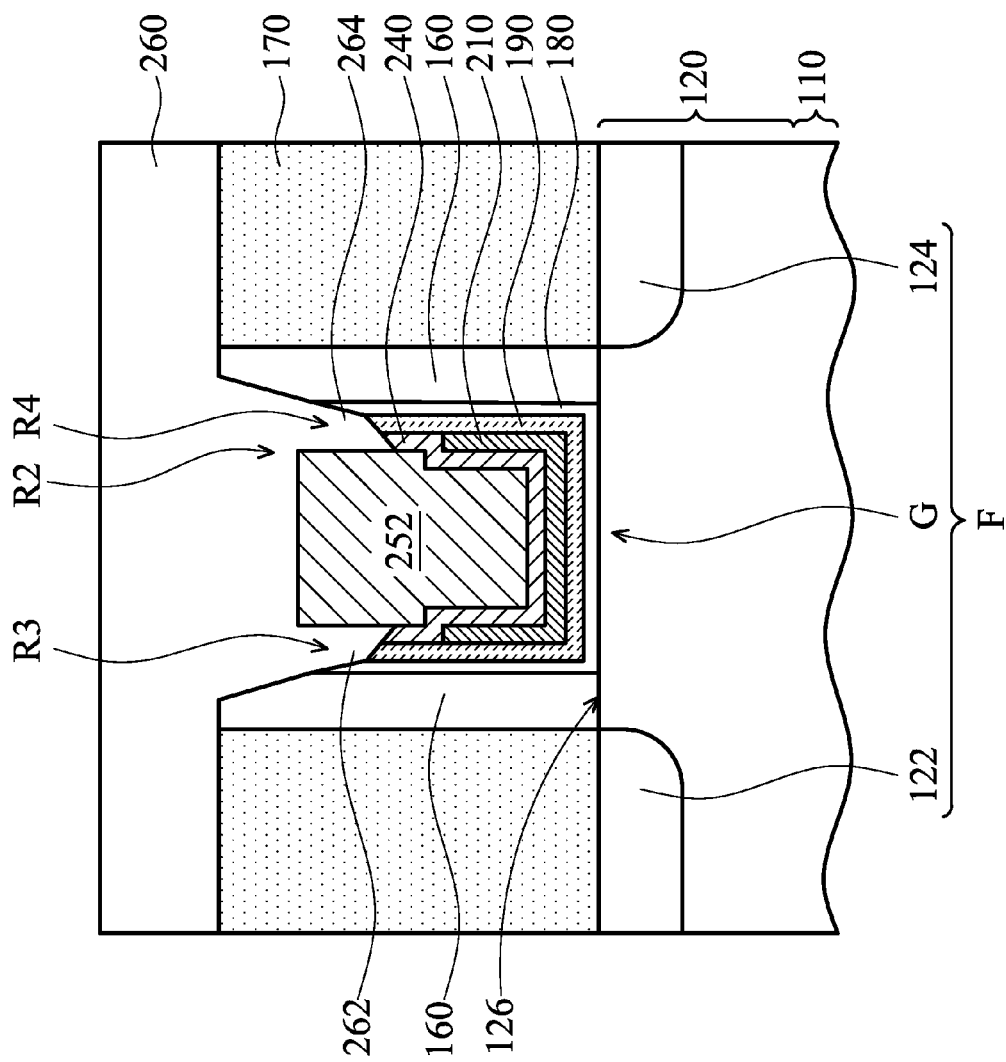
Figure 1Q:
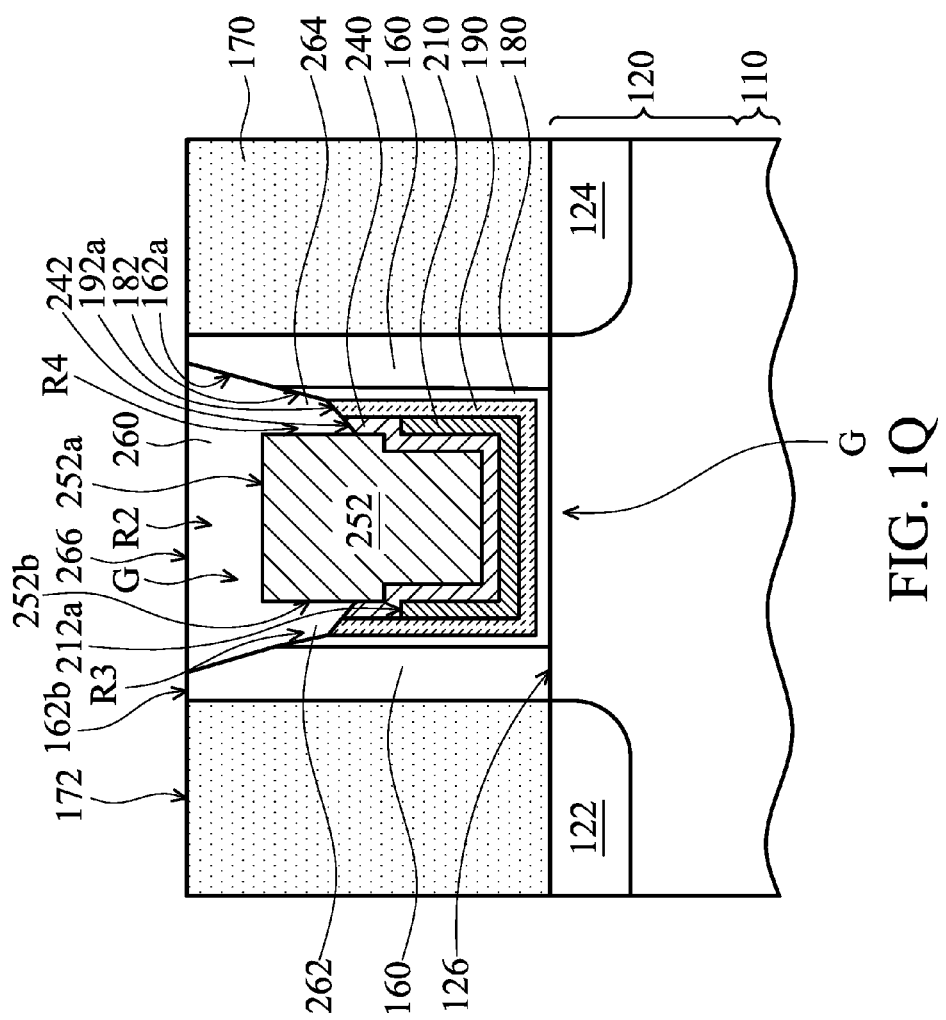
Figure 1R:
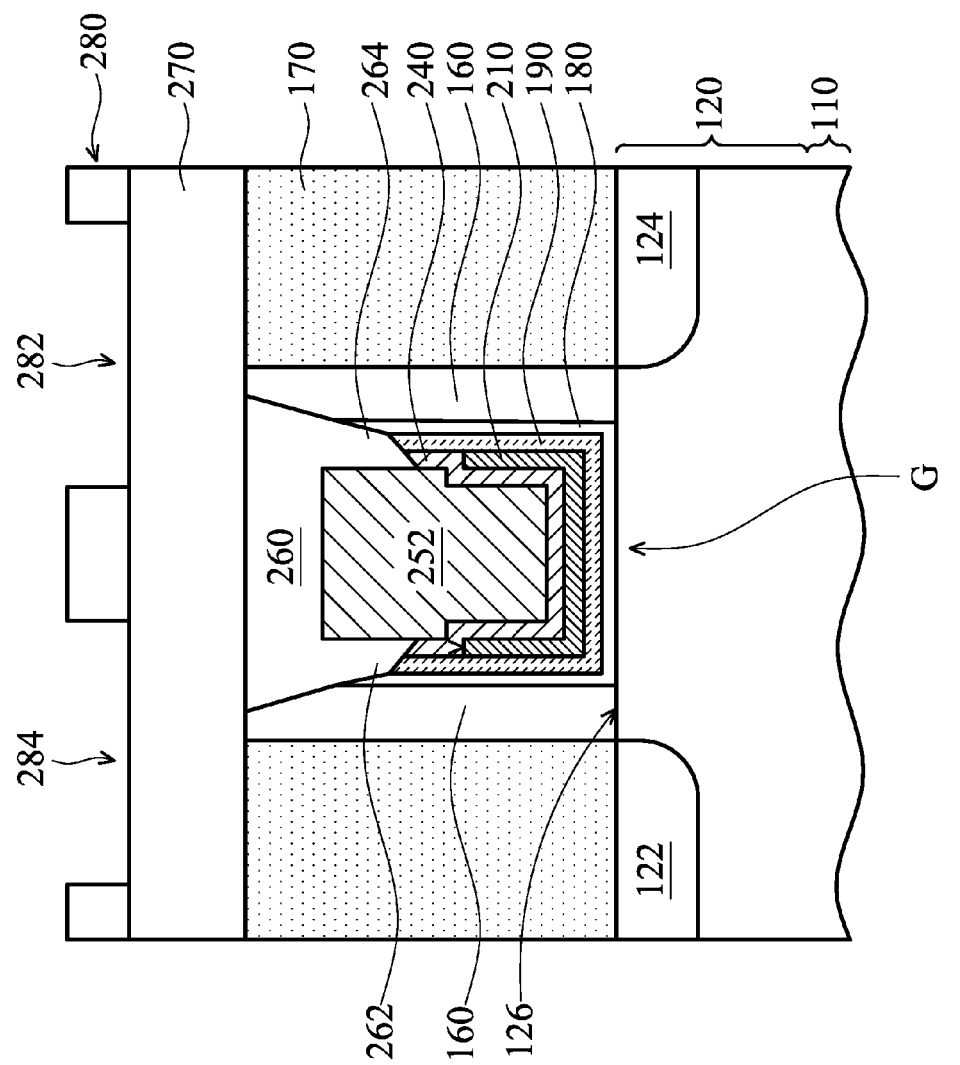
Figure 1S:
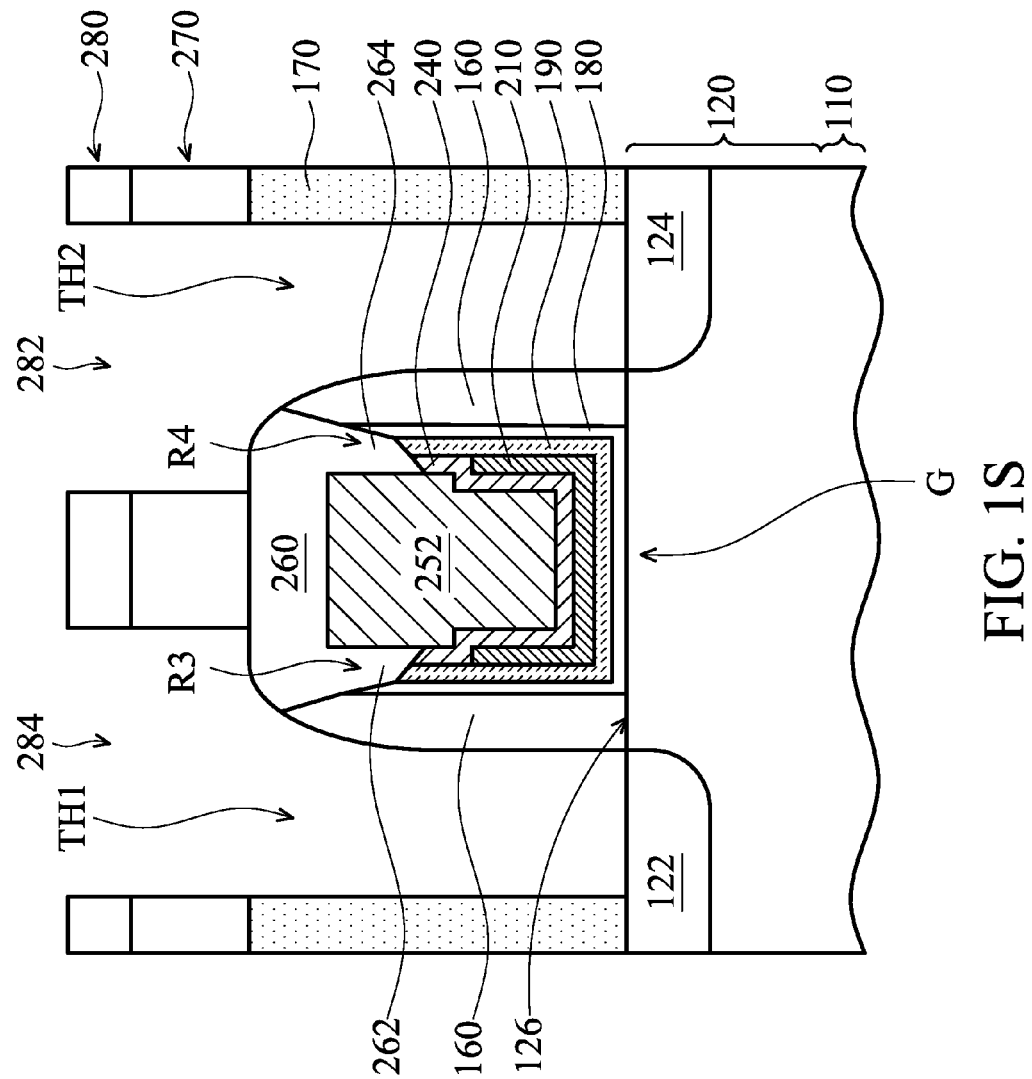
Figure 1T:
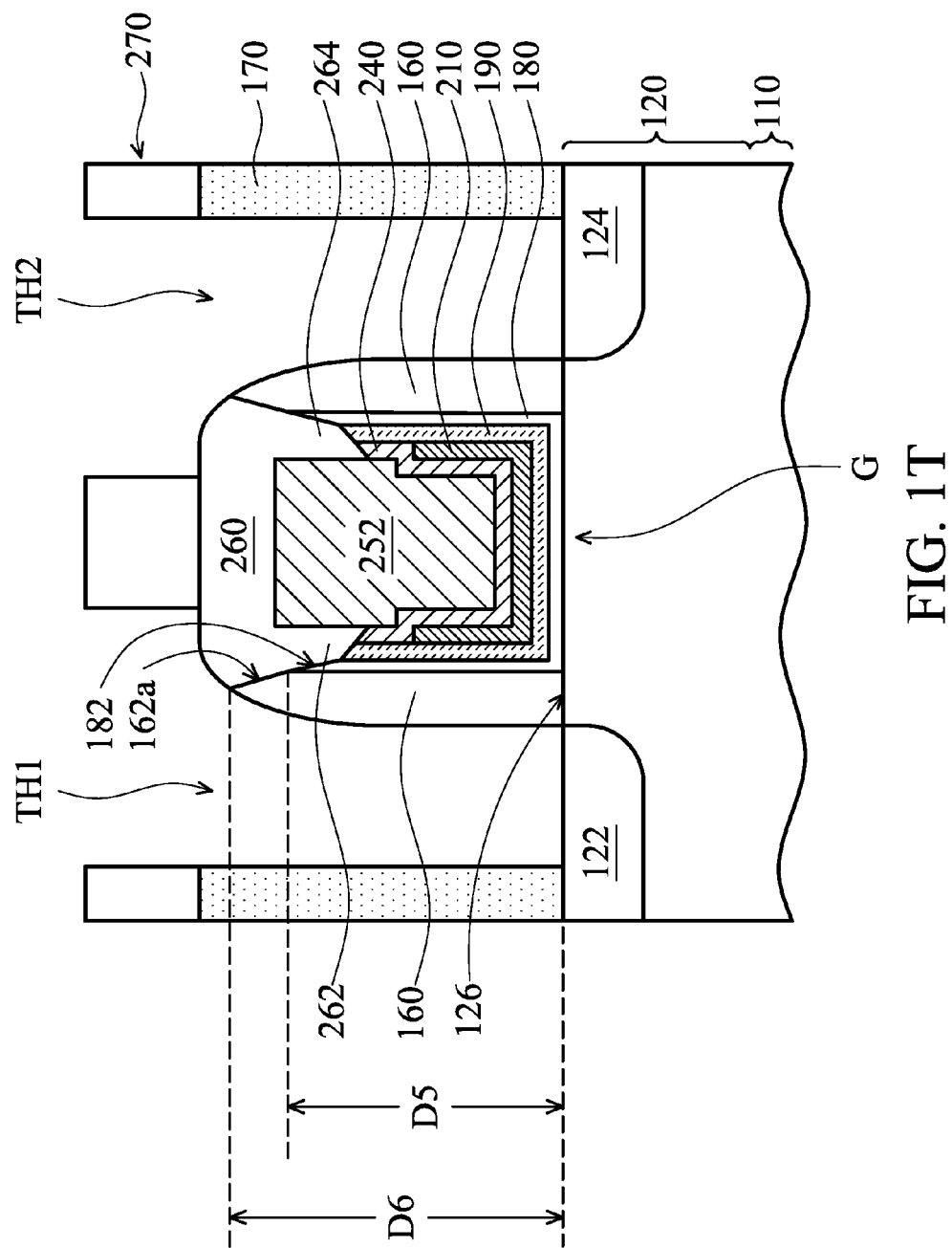
Figure 1U:
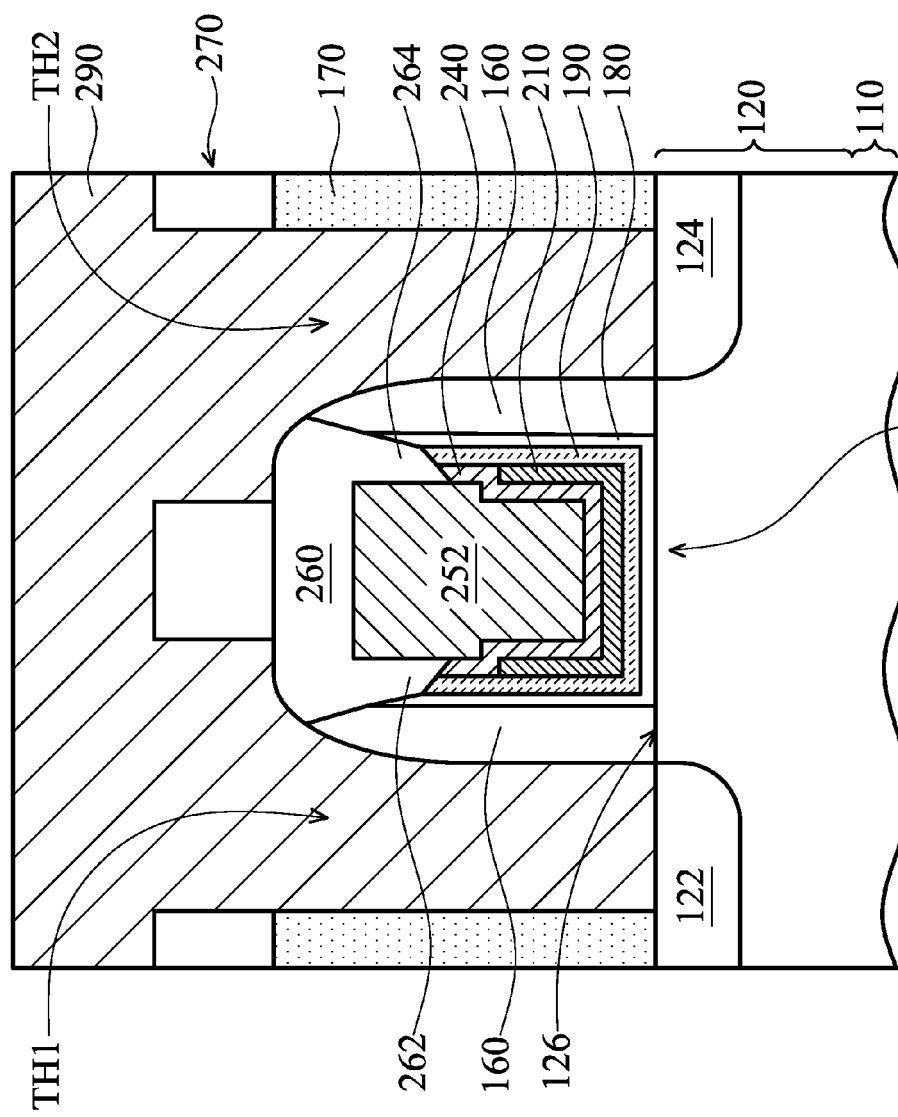
Figure 1V:
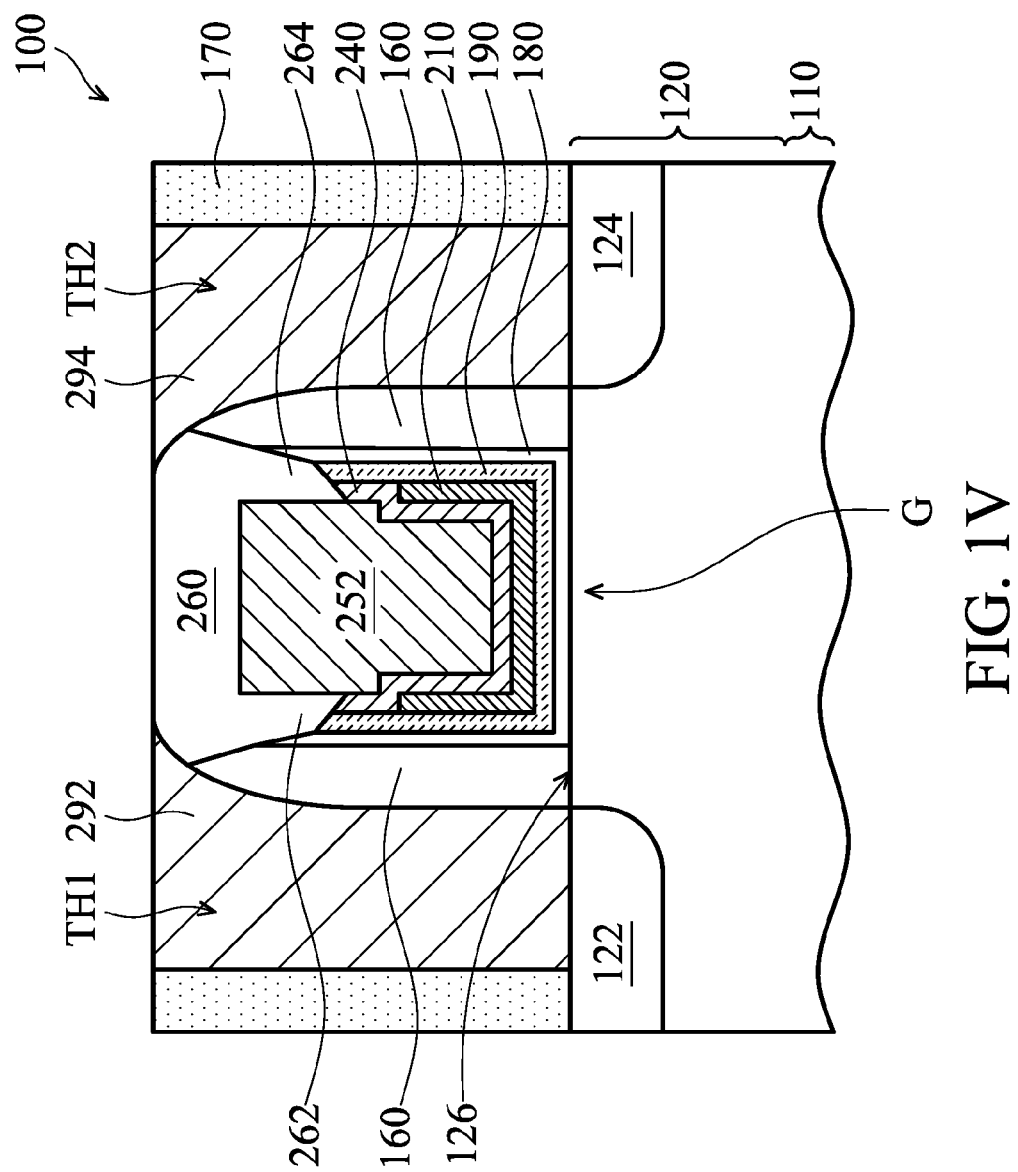
Figure 2A:
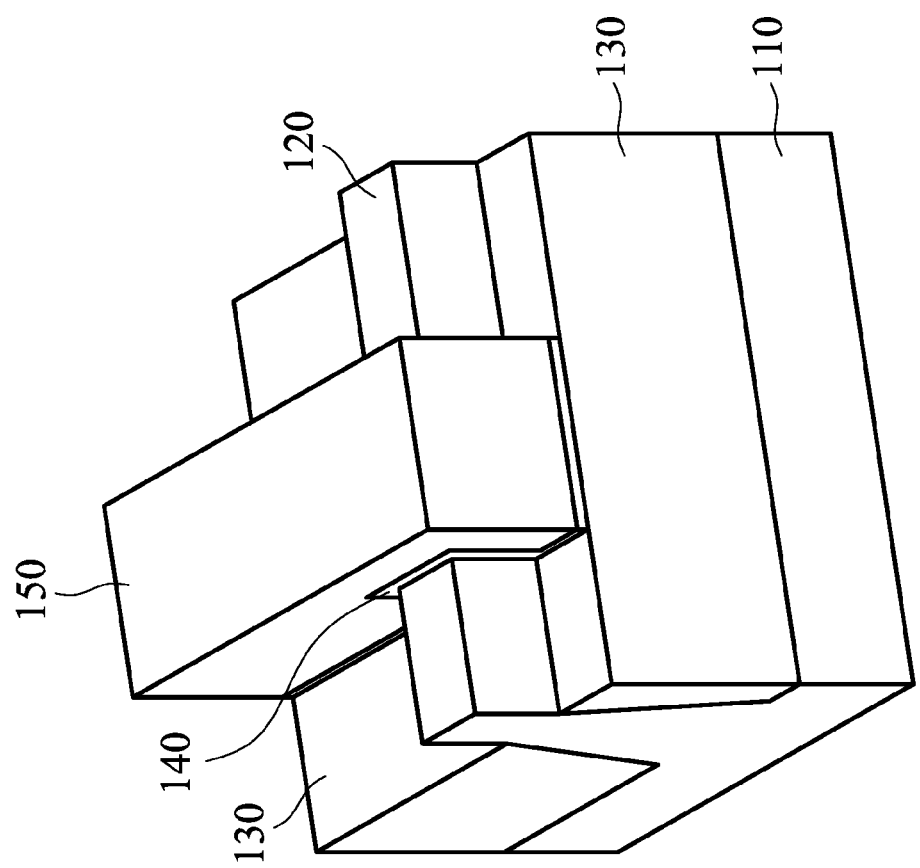
FIG. 2A is a perspective view of the semiconductor device structure of FIG. 1A, in accordance with some embodiments.
Figure 2B:
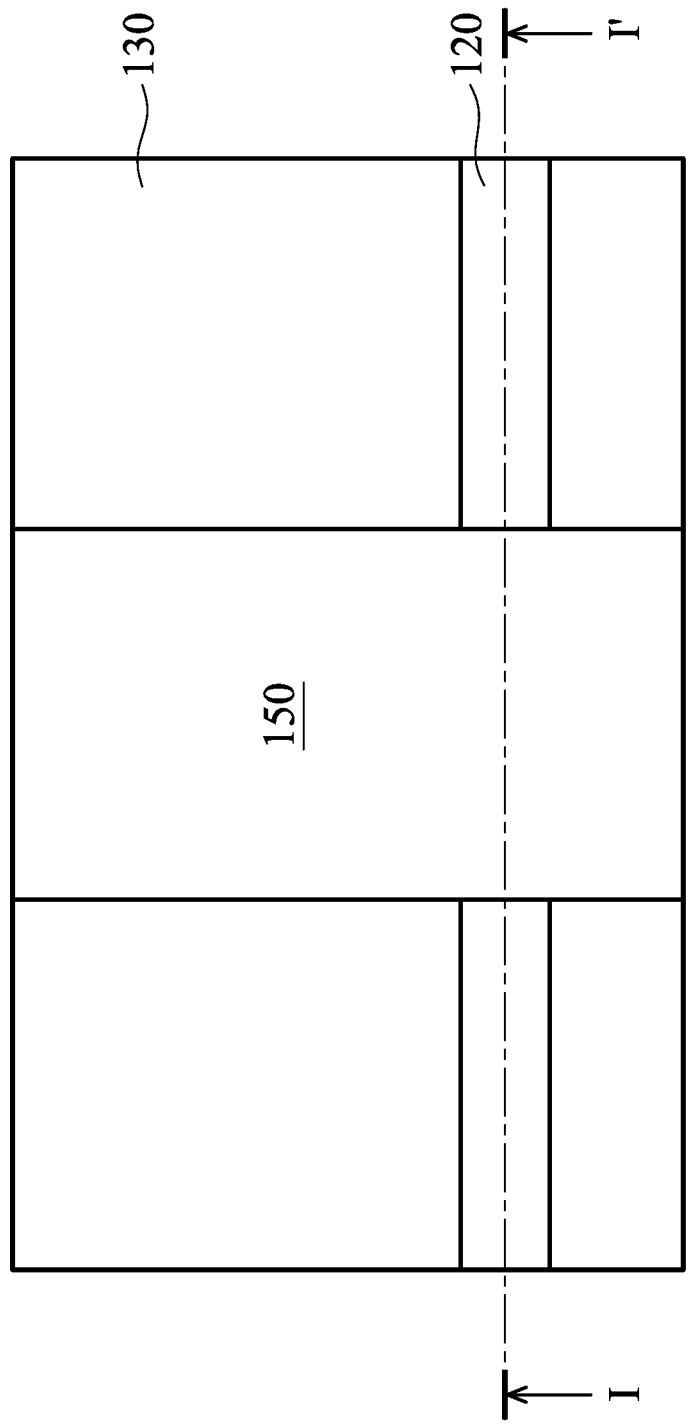
FIG. 2B is a top view of the semiconductor device structure of FIG. 1A, in accordance with some embodiments.
Figure 3:
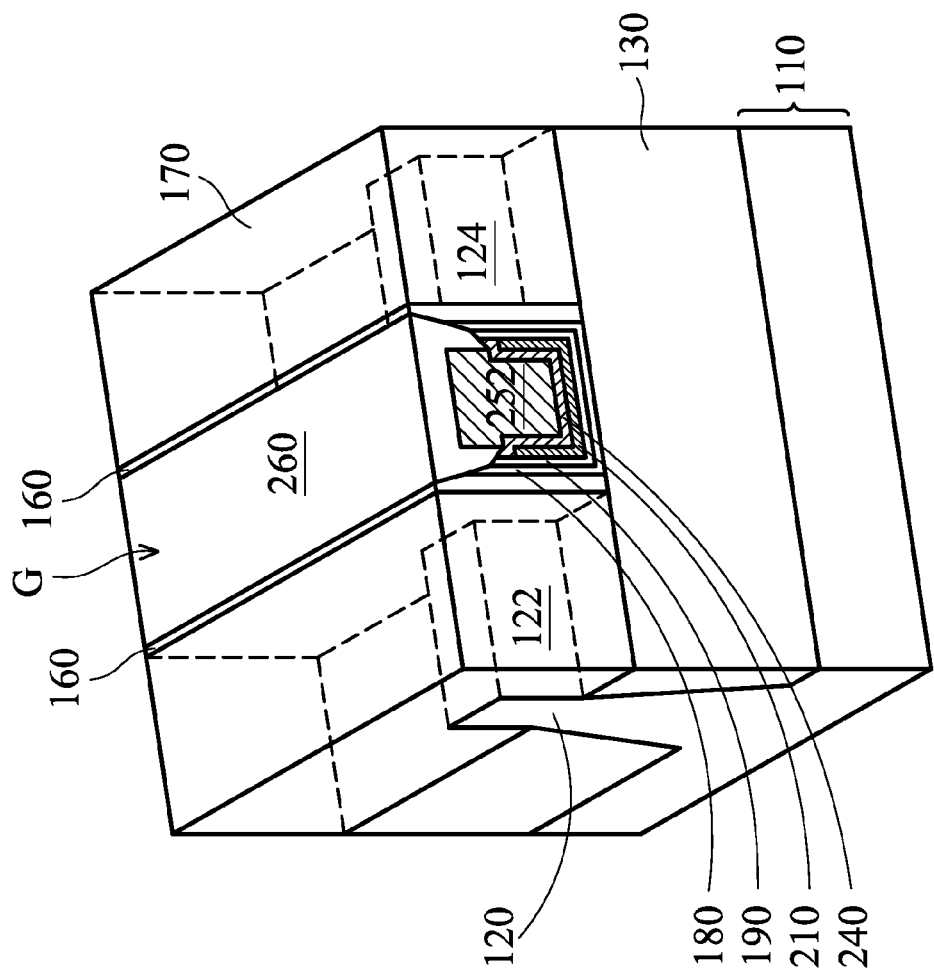
FIG. 3 is a perspective view of the semiconductor device structure of FIG. 1Q, in accordance with some embodiments.

FIGS. 1A-1V are cross-sectional views of various stages of a process for forming a semiconductor device structure 100, in accordance with some embodiments. FIG. 2A is a perspective view of the semiconductor device structure of FIG. 1A, in accordance with some embodiments. FIG. 2B is a top view of the semiconductor device structure of FIG. 1A, in accordance with some embodiments. FIG. 1A is a cross-sectional view illustrating the semiconductor device structure along a sectional line I-I' in FIG. 2B, in accordance with some embodiments. FIG. 3 is a perspective view of the semiconductor device structure of FIG. 1Q, in accordance with some embodiments.

As shown in FIGS. 1A, 2A, and 2B, a substrate 110 is provided, in accordance with some embodiments. The substrate 110 includes a semiconductor substrate, in accordance with some embodiments. The substrate 110 includes a semiconductor wafer (such as a silicon wafer) or a portion of a semiconductor wafer. In some embodiments, the substrate 110 is made of an elementary semiconductor material including silicon or germanium in a single crystal, polycrystal, or amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or combinations thereof. The substrate 110 may also include multi-layer semiconductors, semiconductor on insulator (SOI) (such as silicon on insulator or germanium on insulator), or combinations thereof.

In addition, the substrate 110 may include structures such as doped regions, interlayer dielectric (ILD) layers, and/or conductive features. Furthermore, the substrate 110 may further include single or multiple material layers. For example, the material layers may include a silicon layer, a dielectric layer, and/or a doped polysilicon layer.

As shown in FIGS. 1A, 2A, and 2B, a fin structure 120 is formed over the substrate 110, in accordance with some embodiments. In some embodiments, the fin structure 120 is formed by patterning the substrate 110. For example, the formation of the fin structure 120 includes forming a patterned photoresist layer with openings (not shown) overlying the substrate 110; performing an etching process to remove a portion of the substrate 110 through openings; and removing the patterned photoresist layer. The etching process includes a reactive ion etch (RIE) or other suitable processes.

As shown in FIGS. 1A, 2A, and 2B, an isolation layer 130 is formed over the substrate 110 and surrounds the fin structure 120, in accordance with some embodiments. The isolation layer 130 includes an insulating material, in accordance with some embodiments. The insulating material includes silicon oxide, silicon nitride, silicon oxynitride, another applicable material, or a combination thereof.

The formation of the isolation layer 130 includes forming an isolation material layer (not shown) over the substrate 110 and the fin structure 120; and performing an etching back process on the isolation material layer to expose top portions of the fin structure 120, in accordance with some embodiments. The etching back process includes a dry etching process, in accordance with some embodiments.

As shown in FIGS. 1A, 2A, and 2B, a dummy gate dielectric layer 140 is formed over the fin structure 120 and the isolation layer 130, in accordance with some embodiments. The dummy gate dielectric layer 140 is made of silicon oxide, in accordance with some embodiments. A dummy gate 150 is formed over the dummy gate dielectric layer 140, in accordance with some embodiments. The dummy gate 150 is made of polysilicon, in accordance with some embodiments.

The formation of the dummy gate dielectric layer 140 and the dummy gate 150 includes depositing a dummy gate dielectric material layer (not shown) over the isolation layer 130 and the fin structure 120; depositing a dummy gate material layer (not shown) over the dummy gate dielectric material layer; and patterning the dummy gate material layer and the dummy gate dielectric material layer by a photolithography process and an etching process, in accordance with some embodiments.

The dummy gate dielectric material layer is deposited using a chemical vapor deposition process (CVD process), in accordance with some embodiments. The dummy gate material layer is deposited using a chemical vapor deposition process, in accordance with some embodiments.

As shown in FIG. 1B, a spacer layer 160 is deposited over the dummy gate 150, the dummy gate dielectric layer 140, and the isolation layer 130, in accordance with some embodiments. The spacer layer 160 includes an insulating material, such as silicon oxide or silicon nitride. The spacer layer 160 is formed using a chemical vapor deposition process, in accordance with some embodiments.

As shown in FIGS. 1B and 1C, an anisotropic etching process is performed to remove a portion of the spacer layer 160, in accordance with some embodiments. The spacer layer 160 is configured to electrically isolate a gate formed subsequently from other devices and configured to act as a mask layer in a subsequent ion implantation process, in accordance with some embodiments. The anisotropic etching process includes a dry etching process, in accordance with some embodiments.

As shown in FIG. 1C, heavily doped regions 122 and 124 are formed in the fin structure 120, in accordance with some embodiments. The heavily doped regions 122 and 124 are formed using an ion implantation process, in accordance with some embodiments. The ion implantation process is performed to introduce p-type impurities (e.g., boron) or n-type impurities (e.g., phosphorus) into the fin structure 120, in accordance with some embodiments.

The heavily doped regions 122 and 124 are a heavily doped source region and a heavily doped drain region, in accordance with some embodiments. The heavily doped regions 122 and 124 are located at the two opposite sides of the dummy gate 150, in accordance with some embodiments.

Thereafter, in some embodiments (not shown), stressors are formed in the heavily doped regions 122 and 124 by using suitable processes, in accordance with some embodiments. The suitable processes include, for example, an etching process for removing a portion of the fin structure 120 and a selective epitaxial growth (SEG) process. Depending on the desired type of the resulting FinFET device, either stressors applying a compressive stress to the channel region (such as SiGe stressors) or stressors applying a tensile stress to the channel region (such as SiC stressors) are formed.

Afterwards, in some embodiments (not shown), a contact etch stop layer is formed over the substrate 110 to cover the heavily doped regions 122 and 124, in accordance with some embodiments. The contact etch stop layer includes a dielectric material, in accordance with some embodiments. The contact etch stop layer includes silicon nitride, in accordance with some embodiments. It should be noted that, for the sake of simplicity, FIG. 1C does not show the stressors and the contact etch stop layer.

As shown in FIG. 1D, a dielectric layer 170 is deposited over the substrate 110, in accordance with some embodiments. The dielectric layer 170 covers the isolation layer 130, the fin structure 120, the dummy gate 150, and the spacer layer 160, in accordance with some embodiments.

The dielectric layer 170 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof, in accordance with some embodiments. The dielectric layer 170 is deposited using a CVD process, a HDPCVD process, a spin-on process, a sputtering process, or a combination thereof, in accordance with some embodiments.

Afterwards, as shown in FIG. 1E, a planarization process is performed on the dielectric layer 170 until top surfaces of the dummy gate 150 is exposed, in accordance with some embodiments. The planarization process includes a chemical mechanical polishing (CMP) process, in accordance with some embodiments. After the planarization process is performed, the dielectric layer 170 has a substantially planar surface to facilitate subsequent process steps.

As shown in FIG. 1F, the dummy gate 150 is removed, in accordance with some embodiments. The removal process for removing the dummy gate 150 includes a wet etching process, a dry etching process, or a combination thereof, in accordance with some embodiments. In some embodiments, the dummy gate dielectric layer 140 is also removed.

After the dummy gate 150 and the dummy gate dielectric layer 140 are removed, an opening T is formed in the spacer layer 160, in accordance with some embodiments. The opening T exposes a portion of the fin structure 120, in accordance with some embodiments.

As shown in FIG. 1G, a gate dielectric layer 180 is formed to cover a bottom of the opening T, in accordance with some embodiments. The gate dielectric layer 180 further covers the inner walls of the opening T and top surfaces of the dielectric layer 170 and the spacer layer 160, in accordance with some embodiments.

The gate dielectric layer 180 includes a dielectric material, such as a high dielectric constant (high-k) material. The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof.

The high-k material is made of metal oxides, metal nitrides, metal silicates, transition metal-oxides, transition metal-nitrides, transition metal-silicates, oxynitrides of metals, aluminum oxide, hafnium dioxide-alumina (HfO$_2$—Al$_2$O$_3$) alloy, other suitable materials, or a combination thereof, in accordance with some embodiments.

The gate dielectric layer 180 is deposited by any suitable process, such as atomic layer deposition (ALD), chemical vapor deposition (CVD), physical vapor deposition (PVD), sputtering, plating, other suitable processes, or combinations thereof, in accordance with some embodiments. In some embodiments, the gate dielectric layer 180 needs to be further annealed.

An intermediate dielectric layer (not shown) may be formed over the fin structure 120 before the gate dielectric layer 180 is formed. The intermediate dielectric layer includes a suitable dielectric material, such as silicon oxide, hafnium silicate, silicon oxynitride, or combinations thereof.

As shown in FIG. 1G, a metal silicon nitride layer 190 is formed over the gate dielectric layer 180, in accordance with some embodiments. The metal silicon nitride layer 190 is configured to provide a desired work function for transistors to enhance device performance including improved threshold voltage.

The metal silicon nitride layer 190 is further configured to be a barrier layer, which prevents metal materials formed in the opening T from diffusing into the gate dielectric layer 180, the spacer layer 160, and the dielectric layer 170, in accordance with some embodiments. The metal silicon nitride layer 190 includes titanium silicon nitride (TiSiN), in accordance with some embodiments. The metal silicon nitride layer 190 is deposited using a PVD process, CVD process, ALD process, another suitable method, or combinations thereof, in accordance with some embodiments.

As shown in FIG. 1G, a work function layer 210 is deposited over the metal silicon nitride layer 190, in accordance with some embodiments. The work function layer 210 provides a desired work function for transistors to enhance device performance including improved threshold voltage.

In the embodiments of forming an N-type FinFET, the work function layer 210 can be an n-type metal capable of providing a work function value suitable for the device, such as equal to or less than about 4.5 eV. The n-type metal includes metal, metal carbide, metal nitride, or combinations thereof, in accordance with some embodiments. For example, the n-type metal is made of tantalum, tantalum nitride, or combinations thereof.

On the other hand, in the embodiments of forming a P-type FinFET, the work function layer 210 can be a p-type metal capable of providing a work function value suitable for the device, such as equal to or greater than about 4.8 eV. The p-type metal includes metal, metal carbide, metal nitride, other suitable materials, or a combination thereof, in accordance with some embodiments.

For example, the p-type metal is made of titanium, titanium nitride, other suitable materials, or combinations thereof. The work function layer 210 is deposited using a PVD process, CVD process, ALD process, plating process, another suitable method, or combinations thereof, in accordance with some embodiments.

As shown in FIG. 1H, a mask layer 220 is formed over the work function layer 210, in accordance with some embodiments. In some embodiments, the mask layer 220 covers substantially the entire top surface 212 of the work function layer 210. In some embodiments, the mask layer 220 fills the opening T. The mask layer 220 includes a polymer material (such as a bottom anti-reflective coating material) or other suitable materials. The mask layer 220 is formed using a spin coating process, in accordance with some embodiments.

As shown in FIG. 1H, a mask layer 230 is formed over the mask layer 220, in accordance with some embodiments. The mask layer 230 has an opening 232 over the opening T, in accordance with some embodiments. The opening 232 exposes the mask layer 220 over the opening T, in accordance with some embodiments. In some embodiments, a width W1 of the opening 232 is greater than the width W2 of the opening T. The mask layer 230 includes a photoresist material, titanium nitride, or another suitable material. The mask layers 220 and 230 are made of different materials, in accordance with some embodiments.

As shown in FIG. 1I, a portion of the mask layer 220 over and in the opening T is removed through the opening 232 to form an opening 222 in the mask layer 220, in accordance with some embodiments. The opening 222 exposes a portion of the work function layer 210 over inner walls A1 of the opening T, in accordance with some embodiments.

A portion 224 of the mask layer 220 remains in the opening T to cover the work function layer 210 over a bottom surface B1 of the opening T, in accordance with some embodiments. The removed portion of the mask layer 220 over and in the opening T is removed by a dry etching process, in accordance with some embodiments.

As shown in FIGS. 1I and 1J, the work function layer 210 exposed by the opening 222 is removed, in accordance with some embodiments. After the removal process, the work function layer 210 has a first portion 212 and a second portion 214, in accordance with some embodiments.

The first portion 212 is in the opening T and covered by the portion 224, in accordance with some embodiments. The second portion 214 is outside of the opening T and over the dielectric layer 170, in accordance with some embodiments. In some embodiments, the work function layer 210 exposed by the opening 222 is removed by a wet etching process.

As shown in FIG. 1K, the metal silicon nitride layer 190 exposed by the work function layer 210 is removed, in accordance with some embodiments. The remaining metal silicon nitride layer 190 includes a first portion 192 and a second portion 194, in accordance with some embodiments. The first portion 192 is in the opening T and covered by the first portion 212, in accordance with some embodiments. The second portion 194 is outside of the opening T and over the dielectric layer 170, in accordance with some embodiments.

In some embodiments, a top surface 192a of the first portion 192 is higher than a top surface 212a of the first portion 212, in accordance with some embodiments. That is, a distance D192 between the top surface 192a and a top surface 126 of the fin structure 120 is greater than a distance D212 between the top surfaces 212a and 126, in accordance with some embodiments. In some embodiments, the distance D192 is equal to the distance D212. The removal of the metal silicon nitride layer 190 exposed by the work function layer 210 includes a dry etching process, in accordance with some embodiments.

As shown in FIG. 1L, the mask layers 220 and 230 are removed, in accordance with some embodiments. The mask layers 220 and 230 are removed by an ashing process and/or a wet etching process, in accordance with some embodiments.

As shown in FIG. 1M, a work function layer 240 is formed over the work function layer 210 and the metal silicon nitride layer 190, in accordance with some embodiments. The work function layer 240 has a recess R1 in the opening T, in accordance with some embodiments. The work function layer 240 provides a desired work function for transistors to enhance device performance including improved threshold voltage.

The work function layer 240 includes an n-type metal or a p-type metal, in accordance with some embodiments. The work function layers 210 and 240 are made of different materials, in accordance with some embodiments. The work function layer 240 is formed by a physical vapor deposition process or a chemical vapor deposition process, in accordance with some embodiments.

As shown in FIG. 1N, a gate electrode layer 250 (also called a metal gate electrode layer) is deposited over the work function layer 240 to fill the recess R1, in accordance with some embodiments. The gate electrode layer 250 includes a suitable metal material, such as aluminum, tungsten, gold, platinum, cobalt, another suitable metal, an alloy thereof, or combinations thereof, in accordance with some embodiments. The gate electrode layer 250 is deposited using a PVD process, a CVD process, a plating process, the like, or combinations thereof, in accordance with some embodiments.

Afterwards, as shown in FIG. 1O, the gate electrode layer 250, the work function layers 210 and 240, the metal silicon nitride layer 190, and the gate dielectric layer 180 outside of the opening T, and portions of the gate electrode layer 250, the work function layer 240, the metal silicon nitride layer 190, and the gate dielectric layer 180 in the opening T are removed, in accordance with some embodiments. The removal process includes a dry etching process, in accordance with some embodiments.

After the removal process, the remaining gate electrode layer 250 forms a gate electrode 252, in accordance with some embodiments. After the removal process, the gate electrode 252, the remaining work function layer 240, the remaining work function layer 210, the remaining metal silicon nitride layer 190, and the remaining gate dielectric layer 180 are in the opening T and together form a gate stack G, in accordance with some embodiments. The gate stack G is also referred to as a metal gate stack, in accordance with some embodiments. The gate stack G and the heavily doped regions 122 and 124 together form a fin field effect transistor (FinFET) F, in accordance with some embodiments.

In some embodiments, a recess R2 is formed between the spacer layer 160 and the gate stack G, in accordance with some embodiments. In some embodiments, a top surface 182 of the gate dielectric layer 180 is aligned with a top surface 162a of the spacer layer 160. A top surface 242 of the work function layer 240 is aligned with a top surface 192a of the metal silicon nitride layer 190, in accordance with some embodiments.

In some embodiments, a top surface 252a of the gate electrode 252 is over and spaced apart from a top surface 126 of the fin structure 120 by a distance D1 (or a minimum distance D1). In some embodiments, the top surface 192a of the metal silicon nitride layer 190 is over and spaced apart from the top surface 126 of the fin structure 120 by a distance D2 (or a maximum distance D2).

In some embodiments, the top surface 242 of the work function layer 240 is over and spaced apart from the top surface 126 of the fin structure 120 by a distance D3 (or a maximum distance D3). In some embodiments, a top surface 212a of the work function layer 210 is over and spaced apart from the top surface 126 of the fin structure 120 by a distance D4 (or a maximum distance D4).

Since the etchants used in the removal process have etching selectivity, the etching rate of the gate electrode layer 250 is greater than the etching rate of the metal silicon nitride layer 190, in accordance with some embodiments. Since the removal process of FIG. 1K removes the metal silicon nitride layer 190 exposed by the work function layer 210 first, the removal process of FIG. 1O is able to form the metal silicon nitride layer 190 which is positioned lower than the gate electrode 252 with respect to the top surface 126 of the fin structure 120. Therefore, the distance D1 is greater than the distance D2, in accordance with some embodiments.

The distance D1 is also greater than each of the distances D3 and D4, in accordance with some embodiments. Therefore, recesses R3 and R4 surrounded by the gate electrode 252, the metal silicon nitride layer 190, the work function layer 240, and the gate dielectric layer 180 are formed, in accordance with some embodiments. The recesses R3 and R4 are respectively located on two opposite sides of the gate electrode 252, in accordance with some embodiments. The distance D2 is greater than the distance D3, in accordance with some embodiments. The distance D3 is greater than the distance D4, in accordance with some embodiments. The top surface 252a is higher than each of the top surfaces 192a, 242, and 212a, in accordance with some embodiments.

In some embodiments, the top surface 182 of the gate dielectric layer 180 is over and spaced apart from the top surface 126 of the fin structure 120 by a distance D5 (or a maximum distance D5). The distance D5 is less than or equal to the distance D1, in accordance with some embodiments. The distance D5 is greater than or equal to the distance D2, D3, or D4, in accordance with some embodiments. In some embodiments, the distance D1 is greater than or equal to the distance D2 or D3.

As shown in FIG. 1P, a cap layer 260 is formed over the gate stack G, the spacer layer 160, and the dielectric layer 170 to fill the recesses R2, R3, and R4, in accordance with some embodiments. The cap layer 260 includes silicon nitride, in accordance with some embodiments. The cap layer 260 is formed by a CVD process, a PVD process, or another suitable process.

As shown in FIGS. 1Q and 3, the cap layer 260 outside of the recesses R2, R3, and R4 is removed, in accordance with some embodiments. The remaining cap layer 260 covers the gate dielectric layer 180, the spacer layer 160, the work function layers 240 and 210, the metal silicon nitride layer 190, and the top surface 252a and sidewalls 252b of the gate electrode 252, in accordance with some embodiments.

As a result, the cap layer 260 is able to protect the work function layer 240, the work function layer 210, the metal silicon nitride layer 190, and the gate electrode 252 from damage during subsequent etching processes, in accordance with some embodiments. Therefore, the yield of the semiconductor device structure formed subsequently is improved.

The cap layer 260 is in direct contact with the gate dielectric layer 180, the spacer layer 160, the work function layer 240, the metal silicon nitride layer 190, and the top surface 252a and sidewalls 252b of the gate electrode 252, in accordance with some embodiments. The cap layer 260 has protrusion portions 262 and 264 extending toward the fin structure 120, in accordance with some embodiments. The protrusion portions 262 and 264 are respectively filled in the recesses R3 and R4, in accordance with some embodiments. In some embodiments, a top surface 266 of the cap layer 260, a top surface 162b of the spacer layer 160, and a top surface 172 of the dielectric layer 170 are aligned with each other.

The removal process includes a planarization process, in accordance with some embodiments. The planarization process includes a chemical mechanical polishing (CMP) process or the like, in accordance with some embodiments.

As shown in FIG. 1R, a dielectric layer 270 is deposited over the dielectric layer 170, the spacer layer 160, and the cap layer 260, in accordance with some embodiments. The dielectric layer 270 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof, in accordance with some embodiments.

The dielectric layer 270 is deposited using a CVD process, a HDPCVD process, a spin-on process, a sputtering process, or a combination thereof, in accordance with some embodiments. As shown in FIG. 1R, a mask layer 280 is formed over the dielectric layer 270, in accordance with some embodiments. The mask layer 280 has openings 282 and 284, in accordance with some embodiments. The mask layer 280 includes a hard mask material (e.g. titanium nitride), or another suitable material.

As shown in FIG. 1S, the dielectric layers 270 and 170 under the openings 282 and 284 are removed through the openings 282 and 284, in accordance with some embodiments. The removal process forms through holes TH1 and TH2 in the dielectric layers 270 and 170, in accordance with some embodiments. The through hole TH1 passes through the dielectric layers 270 and 170 and exposes the cap layer 260 and the spacer layer 160, in accordance with some embodiments.

The through hole TH2 passes through the dielectric layers 270 and 170 and exposes the cap layer 260 and the spacer layer 160, in accordance with some embodiments. The through holes TH1 and TH2 are respectively located on two opposite sides of the gate stack G, in accordance with some embodiments. The through holes TH1 and TH2 are partially over the gate stack G, in accordance with some embodiments. The removal process further removes portions of the cap layer 260 and the spacer layer 160, in accordance with some embodiments.

The protrusion portions 262 and 264 prevent the etchants used in the removal process from removing the metal silicon nitride layer 190, the work function layers 210 and 240, and the gate electrode 252, in accordance with some embodiments. The removal process includes a dry etching process or another suitable process.

As shown in FIG. 1T, the mask layer 280 is removed, in accordance with some embodiments. The removal process includes a wet etching process or another suitable process. The protrusion portions 262 and 264 prevent the etchants used in the removal process from removing the metal silicon nitride layer 190, the work function layers 210 and 240, and the gate electrode 252, in accordance with some embodiments.

In some embodiments, the top surface 162a of the spacer layer 160 is over and spaced apart from the top surface 126 of the fin structure 120 by a distance D6 (or a maximum distance D6). The distance D6 is greater than the distance D5 between the top surfaces 182 and 126, in accordance with some embodiments.

As shown in FIG. 1U, a conductive layer 290 is deposited over the dielectric layer 270 to fill the through holes TH1 and TH2, in accordance with some embodiments. The conductive layer 290 includes metal (e.g., tungsten, aluminum, or copper) or another suitable conductive material. The conductive layer 290 is deposited using a physical vapor deposition process, in accordance with some embodiments.

As shown in FIG. 1V, the conductive layer 290 outside of the through holes TH1 and TH2 and the dielectric layer 270 are removed, in accordance with some embodiments. The remaining conductive layer 290 in the through holes TH1 and TH2 forms contact structures 292 and 294, in accordance with some embodiments. The contact structures 292 and 294 are electrically connected to the heavily doped regions 122 and 124, respectively, in accordance with some embodiments. In some embodiments, portions of the contact structures 292 and 294 are over the spacer layer 160 and the cap layer 260. In this step, the semiconductor device structure 100 is substantially formed, in accordance with some embodiments. The semiconductor device structure 100 is a fin-type field effect transistor (FinFET), in accordance with some embodiments.

Figure 4:
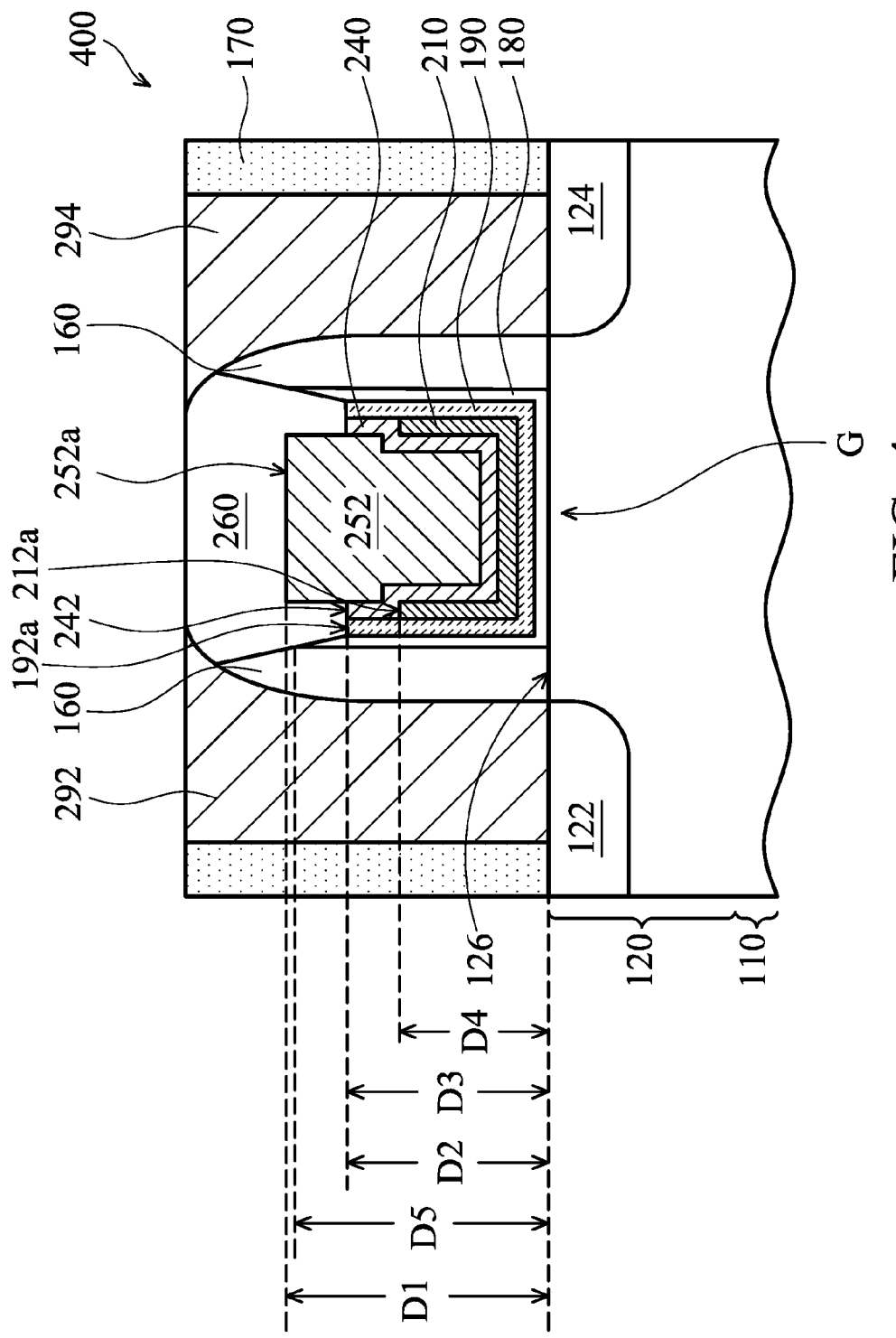
FIG. 4 is a cross-sectional view of a semiconductor device structure 400, in accordance with some embodiments.

FIG. 4 is a cross-sectional view of a semiconductor device structure 400, in accordance with some embodiments. It should be noted that the elements in FIG. 4, which are named and labeled identically to those in FIGS. 1A-1V have materials and structures that are similar thereto. Therefore, detailed descriptions are not repeated herein.

As shown in FIG. 4, the semiconductor device structure 400 is similar to the semiconductor device structure 100 of FIG. 1V, except that in the semiconductor device structure 400, the distance D2 between the top surface 192a of the metal silicon nitride layer 190 and the top surface 126 of the fin structure 120 is equal to the distance D3 between the top surface 242 of the work function layer 240 and the top surface 126, in accordance with some embodiments.

The distance D1 between the top surface 252a of the gate electrode 252 and the top surface 126 is greater than each of the distances D2, D3, and D4, in accordance with some embodiments. The distance D2 or D3 is greater than the distance D4, in accordance with some embodiments.

Figure 5:
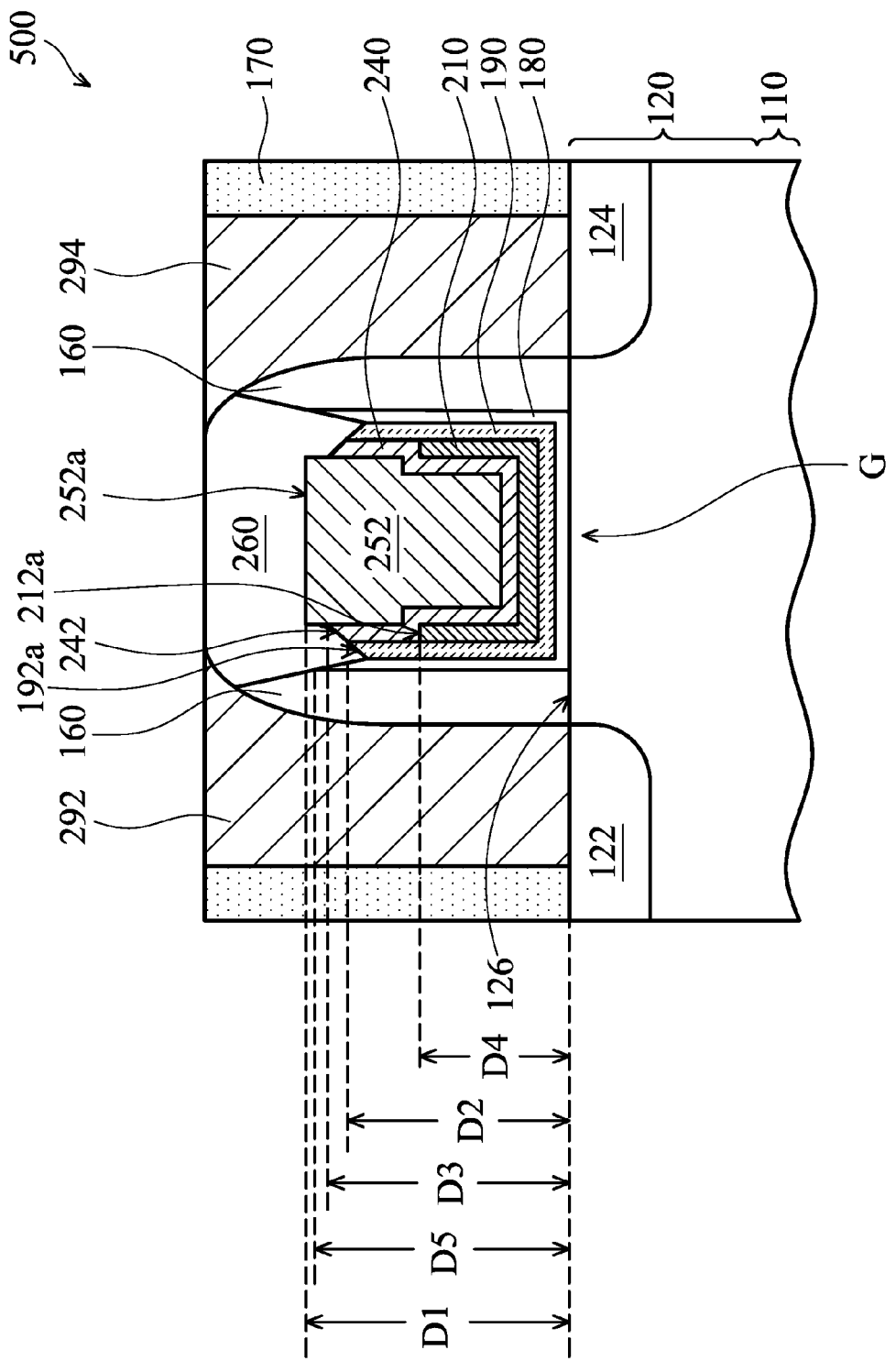
FIG. 5 is a cross-sectional view of a semiconductor device structure 500, in accordance with some embodiments.

FIG. 5 is a cross-sectional view of a semiconductor device structure 500, in accordance with some embodiments. It should be noted that the elements in FIG. 5, which are named and labeled identically to those in FIGS. 1A-1V, have materials and structures that are similar thereto. Therefore, detailed descriptions are not repeated herein.

As shown in FIG. 5, the semiconductor device structure 500 is similar to the semiconductor device structure 100 of FIG. 1V, except that in the semiconductor device structure 500, the distance D2 between the top surface 192a of the metal silicon nitride layer 190 and the top surface 126 of the fin structure 120 is less than the distance D3 between the top surface 242 of the work function layer 240 and the top surface 126, in accordance with some embodiments.

The distance D1 between the top surface 252a of the gate electrode 252 and the top surface 126 is greater than each of the distances D2, D3, and D4, in accordance with some embodiments. The distance D2 is greater than the distance D4, in accordance with some embodiments.

In accordance with some embodiments, semiconductor device structures and methods for forming the same are provided. The methods (for forming the semiconductor device structure) form a metal silicon nitride layer and work function layers which are positioned lower than a gate electrode in an opening of a spacer layer. The methods form a cap layer filled in the opening to cover the metal silicon nitride layer, the work function layers, and the gate electrode. The cap layer prevents etchants used in subsequent removal processes from removing the metal silicon nitride layer, the work function layers, and the gate electrode. Therefore, the yield of the semiconductor device structures is improved.

In accordance with some embodiments, a method for forming a semiconductor device structure is provided. The method includes forming a spacer layer and a dielectric layer over a substrate. The spacer layer has an opening exposing a portion of the substrate, and the dielectric layer surrounds the spacer layer. The method includes forming a metal silicon nitride layer over a sidewall and a bottom surface of the opening. The method includes forming a first work function metal layer over the metal silicon nitride layer. The method includes removing a first top portion of the first work function metal layer. The method includes, after the removal of the first top portion, removing a second top portion of the metal silicon nitride layer. The method includes forming a conductive layer in the opening. The method includes removing a third top portion of the conductive layer and a fourth top portion of the metal silicon nitride layer.

In accordance with some embodiments, a method for forming a semiconductor device structure is provided. The method includes forming a spacer layer and a dielectric layer over a fin structure. The fin structure is over a substrate. The spacer layer has an opening exposing a portion of the fin structure. The dielectric layer surrounds the spacer layer. The method includes forming a metal silicon nitride layer over a sidewall and a bottom surface of the opening. The method includes forming a first work function metal layer over the metal silicon nitride layer. The method includes removing a first top portion of the first work function metal layer. The method includes, after the removal of the first top portion, removing a second top portion of the metal silicon nitride layer. The method includes forming a conductive layer in the opening. The method includes removing a third top portion of the conductive layer and a fourth top portion of the metal silicon nitride layer.

In accordance with some embodiments, a semiconductor device structure is provided. The semiconductor device structure includes a substrate. The semiconductor device structure includes a gate stack over the substrate. The gate stack includes a gate electrode, a first work function layer, a second work function layer, and a metal silicon nitride layer. The metal silicon nitride layer is over a sidewall and a bottom surface of the gate electrode. The first work function layer is between the gate electrode and the metal silicon nitride layer. The second work function layer is between the gate electrode and the first work function layer. A first top surface of the gate electrode is higher than each of a second top surface, a third top surface, a fourth top surface of the first work function layer, the second work function layer, and the metal silicon nitride layer. The semiconductor device structure includes a spacer layer surrounding the gate stack. The semiconductor device structure includes a dielectric layer over the substrate and surrounding the spacer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

forming a spacer layer and a dielectric layer over a substrate, wherein the spacer layer has an opening exposing a portion of the substrate, and the dielectric layer surrounds the spacer layer;

forming a metal silicon nitride layer over an inner wall and a bottom surface of the opening;

forming a first work function metal layer over the metal silicon nitride layer;

removing a first top portion of the first work function metal layer;

after the removal of the first top portion, removing a second top portion of the metal silicon nitride layer;

forming a conductive layer in the opening; and removing a third top portion of the conductive layer and a fourth top portion of the metal silicon nitride layer.

2. The method for forming the semiconductor device structure as claimed in claim 1, wherein the removal of the first top portion comprises:

forming a mask layer in the opening and over the first work function metal layer, wherein the mask layer does not cover the first top portion; and performing an etching process to remove the first top portion.

3. The method for forming the semiconductor device structure as claimed in claim 2, wherein the removal of the second top portion of the metal silicon nitride layer comprises:

removing the metal silicon nitride layer, which is not covered by the first work function metal layer and the mask layer.

4. The method for forming the semiconductor device structure as claimed in claim 3, wherein the removal of the second top portion of the metal silicon nitride layer comprises a dry etching process.

5. The method for forming the semiconductor device structure as claimed in claim 1, further comprising:

after the removal of the second top portion of the metal silicon nitride layer, forming a second work function metal layer over the metal silicon nitride layer and the first work function metal layer, wherein the removal of the third top portion of the conductive layer further comprises removing a fifth top portion of the second work function metal layer.

6. The method for forming the semiconductor device structure as claimed in claim 1, wherein the formation of the metal silicon nitride layer comprises a deposition process.

7. The method for forming the semiconductor device structure as claimed in claim 1, wherein after the removal of the third top portion of the conductive layer and the fourth top portion of the metal silicon nitride layer, the remaining conductive layer forms a gate electrode, and a first top surface of the gate electrode is higher than a second top surface of the remaining metal silicon nitride layer.

8. The method for forming the semiconductor device structure as claimed in claim 1, wherein after the removal of the first top portion of the first work function metal layer and the second top portion of the metal silicon nitride layer, and a first top surface of the remaining metal silicon nitride layer is higher than a second top surface of the remaining first work function metal layer.

9. A method for forming a semiconductor device structure, comprising:

forming a spacer layer and a dielectric layer over a fin structure, wherein the fin structure is over a substrate, the spacer layer has an opening exposing a portion of the fin structure, and the dielectric layer surrounds the spacer layer;

forming a metal silicon nitride layer over an inner wall and a bottom surface of the opening;

forming a first work function metal layer over the metal silicon nitride layer;

removing a first top portion of the first work function metal layer;

after the removal of the first top portion, removing a second top portion of the metal silicon nitride layer;

forming a conductive layer in the opening; and removing a third top portion of the conductive layer and a fourth top portion of the metal silicon nitride layer.

10. The method for forming the semiconductor device structure as claimed in claim 9, wherein during the removal of the third top portion and the fourth top portion, a first removal rate of the conductive layer is greater than a second removal rate of the metal silicon nitride layer, and after the removal of the third top portion and the fourth top portion, a first top surface of the remaining conductive layer is higher than a second top surface of the remaining metal silicon nitride layer.

11. The method for forming the semiconductor device structure as claimed in claim 9, further comprising:

after the removal of the second top portion of the metal silicon nitride layer, forming a second work function metal layer over the metal silicon nitride layer and the first work function metal layer, wherein the removal of the third top portion of the conductive layer further comprises removing a fifth top portion of the second work function metal layer.

12. The method for forming the semiconductor device structure as claimed in claim 11, wherein the second work function metal layer is in direct contact with the metal silicon nitride layer and the first work function metal layer.

13. The method for forming the semiconductor device structure as claimed in claim 11, wherein after the removal of the third top portion, the fourth top portion, and the fifth top portion, a first recess surrounded by the conductive layer, the metal silicon nitride layer, the second work function metal layer, and the spacer layer and a second recess surrounded by the conductive layer and the spacer layer are formed.

14. The method for forming the semiconductor device structure as claimed in claim 13, further comprising:

after the formation of the first recess and the second recess, forming a cap layer into the first recess and the second recess to fill the first recess and the second recess.

15. The method for forming the semiconductor device structure as claimed in claim 14, wherein the cap layer is in direct contact with the conductive layer, the metal silicon nitride layer, the second work function metal layer, and the spacer layer.

16. A method for forming a semiconductor device structure, comprising:

forming a spacer layer and a dielectric layer over a substrate, wherein the spacer layer has an opening exposing a portion of the substrate, and the dielectric layer surrounds the spacer layer;

forming a gate dielectric layer over an inner wall and a bottom surface of the opening;

forming a metal silicon nitride layer over the gate dielectric layer;

forming a first work function metal layer over the metal silicon nitride layer;

removing a first top portion of the first work function metal layer;

after the removal of the first top portion, removing a second top portion of the metal silicon nitride layer;

forming a conductive layer in the opening; and removing a third top portion of the conductive layer, a fourth top portion of the metal silicon nitride layer, and a fifth top portion of the gate dielectric layer.

17. The method for forming the semiconductor device structure as claimed in claim 16, further comprising:

after the removal of the second top portion of the metal silicon nitride layer, forming a second work function metal layer over the metal silicon nitride layer and the first work function metal layer, wherein the removal of the third top portion of the conductive layer further comprises removing a sixth top portion of the second work function metal layer.

18. The method for forming the semiconductor device structure as claimed in claim 17, wherein the removal of the third top portion of the conductive layer further comprises removing a seventh top portion of the spacer layer.

19. The method for forming the semiconductor device structure as claimed in claim 18, wherein after the removal of the third top portion of the conductive layer, the fourth top portion of the metal silicon nitride layer, the fifth top portion of the gate dielectric layer, the sixth top portion of the second work function metal layer, and the seventh top portion of the spacer layer, a first top surface of the gate dielectric layer is aligned with a second top surface of the spacer layer, and a third top surface of the second work function metal layer is aligned with a fourth top surface of the metal silicon nitride layer.

20. The method for forming the semiconductor device structure as claimed in claim 18, wherein after the removal of the third top portion of the conductive layer, the fourth top portion of the metal silicon nitride layer, the fifth top portion of the gate dielectric layer, the sixth top portion of the second work function metal layer, and the seventh top portion of the spacer layer, a first recess and a second recess are formed, the first recess is surrounded by the conductive layer, the second work function metal layer, the metal silicon nitride layer, and the gate dielectric layer, the second recess is surrounded by the conductive layer and the spacer layer, and the method further comprises:

forming a cap layer into the first recess and the second recess to fill the first recess and the second recess, wherein the cap layer is in direct contact with the second work function metal layer, the metal silicon nitride layer, the gate dielectric layer, the spacer layer, and a top surface and sidewalls of the conductive layer.

* * * * *